(12) United States Patent
Doehring et al.

(10) Patent No.: US 11,327,465 B2
(45) Date of Patent: May 10, 2022

(54) METHOD AND SYSTEM TO FABRICATE A THREE-DIMENSIONAL META-STRUCTURE WORKPIECE

(71) Applicant: Abemis LLC, Cleveland, OH (US)

(72) Inventors: Todd Curtis Doehring, Cleveland, OH (US); William Joseph Nelson, Solon, OH (US)

(73) Assignee: Abemis LLC, Cleveland, OH (US)

( * ) Notice: Subject to any disclaimer, the term of this patent is extended or adjusted under 35 U.S.C. 154(b) by 0 days.

(21) Appl. No.: 16/806,440

(22) Filed: Mar. 2, 2020

(65) Prior Publication Data

US 2020/0310385 A1 Oct. 1, 2020

Related U.S. Application Data

(63) Continuation of application No. 15/935,650, filed on Mar. 26, 2018, now Pat. No. 10,585,420.

(60) Provisional application No. 62/581,799, filed on Nov. 6, 2017.

(51) Int. Cl.
| | |
|---|---|
| *G06T 15/00* | (2011.01) |
| *G05B 19/4099* | (2006.01) |
| *B33Y 50/02* | (2015.01) |
| *G06F 30/23* | (2020.01) |
| *B33Y 80/00* | (2015.01) |
| *B33Y 70/00* | (2020.01) |

(52) U.S. Cl.
CPC ......... *G05B 19/4099* (2013.01); *B33Y 50/02* (2014.12); *G06F 30/23* (2020.01); *B33Y 70/00* (2014.12); *B33Y 80/00* (2014.12); *G05B 2219/35134* (2013.01); *G05B 2219/49007* (2013.01); *G05B 2219/49038* (2013.01)

(58) Field of Classification Search
CPC ...... G05B 19/4099; G05B 2219/35134; G05B 2219/49007; B33Y 50/02; B33Y 70/00; B33Y 80/00; G06F 17/5018
USPC ........................................................ 345/418
See application file for complete search history.

(56) References Cited

U.S. PATENT DOCUMENTS

| | | | | |
|---|---|---|---|---|
| 9,296,129 | B2* | 3/2016 | Pallari | B29C 33/3835 |
| 9,529,213 | B2* | 12/2016 | Fonte | G16B 5/00 |
| 9,561,622 | B2* | 2/2017 | Das | B33Y 10/00 |

(Continued)

FOREIGN PATENT DOCUMENTS

| | | |
|---|---|---|
| WO | 2010120990 A1 | 10/2010 |
| WO | 2015057546 A1 | 4/2015 |

OTHER PUBLICATIONS

Azman, Abdul Hadi. "Method for integration of lattice structures in design for additive manufacturing." PhD diss., 2017.*

(Continued)

*Primary Examiner* — Phu K Nguyen
(74) *Attorney, Agent, or Firm* — Meunier Carlin & Curfman LLC

(57) ABSTRACT

The exemplified methods and systems facilitate manufacturing of a new class of mechanical, loading-bearing components having optimized stress/strain three-dimensional meta-structure structures (also referred to herein as "Meshagons") as finite-element-based 3D volumetric mesh structures. The resulting three-dimensional meta-structure structures provide high strength, ultra-light connectivity, with programmable interlinkage properties (e.g., density/porosity of linkages).

20 Claims, 12 Drawing Sheets

(56) References Cited

U.S. PATENT DOCUMENTS

| | | | |
|---|---|---|---|
| 9,962,274 B2* | 5/2018 | Kusleika | A61F 2/91 |
| 10,336,055 B2* | 7/2019 | Das | B29C 35/0805 |
| 10,406,601 B2* | 9/2019 | Martin | F28F 3/12 |
| 10,585,420 B2* | 3/2020 | Doehring | B33Y 50/02 |
| 10,687,967 B2* | 6/2020 | Kusleika | A61F 2/91 |
| 2014/0217647 A1 | 8/2014 | Pallari | |
| 2014/0336807 A1 | 11/2014 | Smith et al. | |
| 2015/0212343 A1 | 7/2015 | Fonte et al. | |
| 2017/0281367 A1* | 10/2017 | Ketchum | A61F 2/52 |
| 2019/0137972 A1* | 5/2019 | Doehring | B33Y 50/02 |
| 2019/0170444 A1* | 6/2019 | Magee | F28B 1/00 |
| 2019/0299522 A1* | 10/2019 | Chapiro | B29C 70/38 |
| 2020/0023584 A1* | 1/2020 | Portela | B29C 64/10 |

OTHER PUBLICATIONS

Wulle F, Coupek D, Schäffner F, Verl A, Oberhofer F, Maier T. Workpiece and machine design in additive manufacturing for multi-axis fused deposition modeling. Procedia CIRP. Jan. 1, 2017;60:229-34.*

Doehring, T., Nelson, W., Harris, T. et al. FE vibration analyses of novel conforming meta-structures and standard lattices for simple bricks and a topology-optimized aerodynamic bracket. Sci Rep 10, 21484 (2020). https://doi.org/10.1038/s41598-020-78239-9.*

Smith J, Xiong W, Yan W, Lin S, Cheng P, Kafka OL, Wagner GJ, Cao J, Liu WK. Linking process, structure, property, and performance for metal-based additive manufacturing: computational approaches with experimental support. Computational Mechanics. Apr. 1, 2016;57(4):583-610.*

Saadlaoui Y, Milan JL, Rossi JM, Chabrand P. Topology optimization and additive manufacturing: Comparison of conception methods using industrial codes. Journal of Manufacturing Systems. Apr. 1, 2017;43:178-86.*

Brackett D, Ashcroft I, Hague R. Topology optimization for additive manufacturing. InProceedings of the solid freeform fabrication symposium, Austin, TX Aug. 8, 2011 (vol. 1, pp. 348-362).*

Gebisa AW, Lemu HG. A case study on topology optimized design for additive manufacturing. InIOP Conference Series: Materials Science and Engineering Dec. 2017 (vol. 276, No. 1, p. 012026).*

Larsson, Methodology for Topology and Shape Optimization: Application to a Rear Lower Control Arm, 2016, Master Thesis, Chalmers University of technology, Sweden.*

Browne, Topology Optimization of Linear Elastic Structures, 2013, Ph.D. Thesis, dept. of mathematical Sciences, University of Bath.*

Gaynor AT, Guest JK. Topology optimization considering overhang constraints: Eliminating sacrificial support material in additive manufacturing through design. Structural and Multidisciplinary Optimization. Nov. 1, 2016;54(5):1157-72.*

Wu J, Aage N, Westermann R, Sigmund O. Infill optimization for additive manufacturing—approaching bone-like porous structures. IEEE transactions on visualization and computer graphics. Jan. 23, 2017;24(2):1127-40.*

Zegard, T. and Paulino, G.H., 2015. Bridging topology optimization and additive manufacturing.*

Jared BH, Aguilo MA, Beghini LL, Boyce BL, Clark BW, Cook A, Kaehr BJ, Robbins J. Additive manufacturing: Toward holistic design. Scripta Materialia. Jul. 1, 2017;135:141-7.*

Liu C, Du Z, Zhang W, Zhu Y, Guo X. Additive manufacturing-oriented design of graded lattice structures through explicit topology optimization. Journal of Applied Mechanics. Aug. 1, 2017;84(8).*

Tao W, Leu MC. Design of lattice structure for additive manufacturing. In2016 International Symposium on Flexible Automation (ISFA) Aug. 1, 2016 (pp. 325-332). IEEE.*

International Search Report and Written Opinion issued in corresponding application No. PCT/US2018/059396, dated May 21, 2019, 13 pages.

* cited by examiner

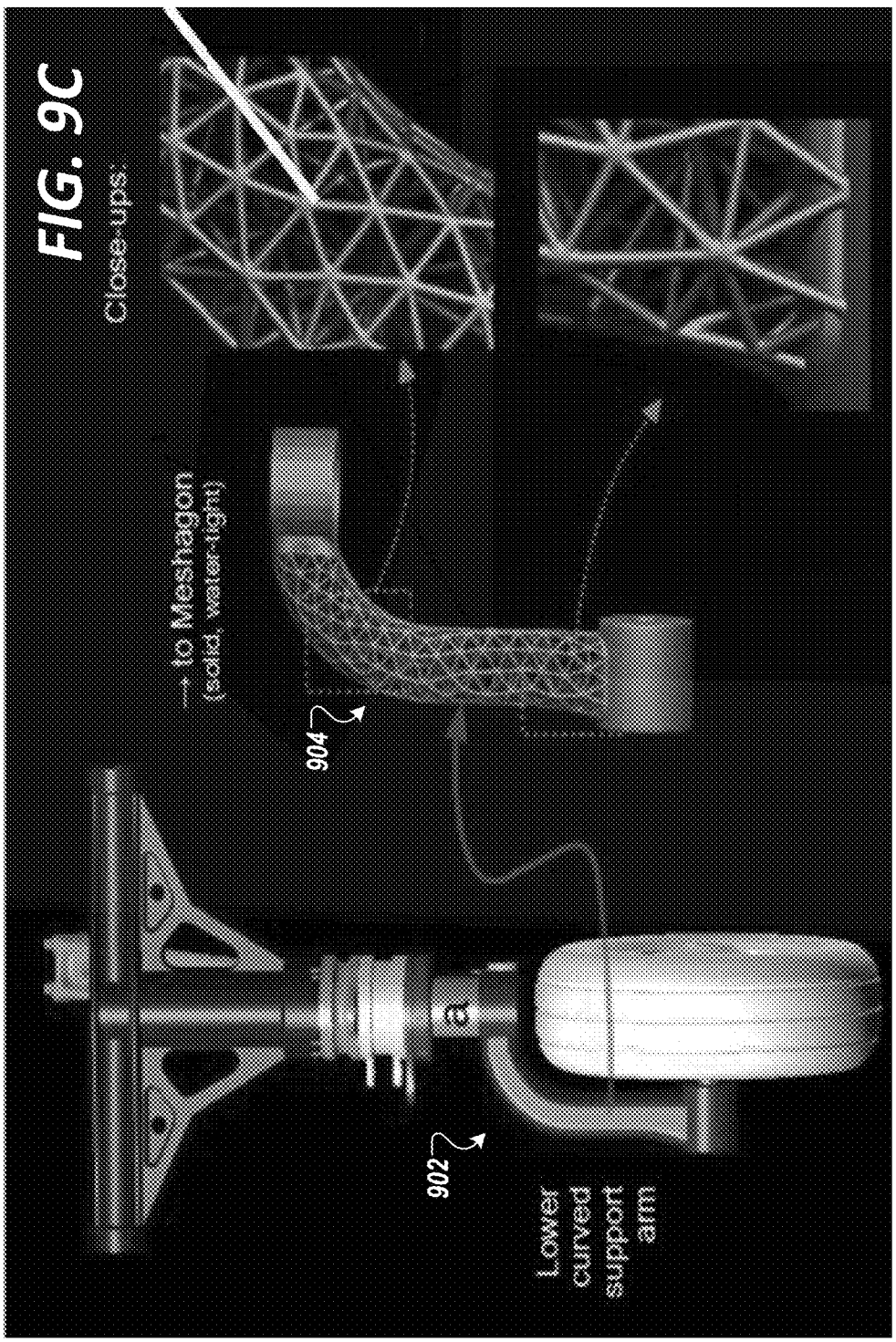

METHOD AND SYSTEM TO FABRICATE A THREE-DIMENSIONAL META-STRUCTURE WORKPIECE

RELATED APPLICATION

This is a continuation application of U.S. patent application Ser. No. 15/935,650, filed Mar. 26, 2018, entitled "METHOD AND SYSTEM TO GENERATE THREE-DIMENSIONAL META-STRUCTURE MODEL OF A WORKPIECE," now U.S. Pat. No. 10,585,420, which claims priority to, and the benefit of, U.S. Provisional Appl. No. 62/581,799, filed Nov. 6, 2017, entitled "Meshagons: Novel Meta-mesh structures for applications to engineering, architecture, and physics," each of which is incorporated by reference herein in its entirety.

TECHNICAL FIELD

The present disclosure generally relates to methods and systems for generating a three-dimensional meta-structure model of a workpiece, in particular a three-dimensional meta-structure model having mesh-based optimized structures that are suitable for production with Additive Manufacturing (AM) systems.

BACKGROUND

Additive Manufacturing (AM) systems are rapidly evolving. Recent development in additive Manufacturing technologies now allows for manufacturing of implants and prosthetics using medical grade materials.

Finite element analysis are computer-based methods of simulating and analyzing behavior of engineering structures and components that augment or replace experimental testing.

Though there has been great advancements in manufacturing and in the design of mechanical systems via additive manufacturing technology and via use of computer assisted design technologies, there is still yet a great need for improved designs of mechanical systems.

SUMMARY

The exemplified methods and systems facilitate manufacturing of a new class of mechanical, loading-bearing components having optimized stress/strain three-dimensional meta-structure structures (also referred to herein as "Meshagons") as finite-element-based 3D volumetric mesh structures. In having these three-dimensional meta-structures replace mechanical, load bearing elements in a workpiece, the strength of the workpiece can be maintained while other elements that do not contribute to the strength can be removed. In essence, the resulting three-dimensional meta-structure structures provide high strength, ultra-light connectivity, with programmable interlinkage properties (e.g., density/porosity of linkages).

The three-dimensional volumetric mesh structures can have any number of additional multi-dimensional parametric definitions and descriptions that can be used to define the structure. With such parametric definitions and descriptions, the volumetric mesh structures can be considered a 4-dimensional meta-structures, a 5-dimensional meta-structure, to an n-dimensional meta-structure.

In an aspect, a computer-implemented method is disclosed to generate a three-dimensional meta-structure model of a workpiece for use in an additive manufacturing process.

The method includes obtaining or creating, by a processor, a source three-dimensional model (e.g., CAD solid model, computed tomography-based (CT) model, stereolithographic (STL) model) of a workpiece; obtaining or creating, by the processor, a portion of the source three-dimensional model to convert to a first three-dimensional meta-structure sub-model (e.g., a first-level Meshagon portion of the CAD model); and, generating, by the processor, a model of the workpiece having the first three-dimensional meta-structure sub-model (e.g., ML-1 sub-model) by: converting, by the processor, the portion of the source three-dimensional model to a first finite element mesh structure, wherein the first finite element mesh structure comprises a plurality of interlinking linkages (e.g., edges) and joints (e.g., nodes) that collectively form a three-dimensional manifold structure of tetrahedral, hexahedral, and/or fractal elements (e.g., pre-selected element types); and, varying, by the processor, cross-sectional areas of each of the linkages and joints of the first finite element mesh structure according to a specified profile (e.g., according a defined AlphaShape or a modified-AlphaShape (e.g., "Meta-balls")) to produce the first three-dimensional meta-structure sub-model; wherein the generated three-dimensional meta-structure model is used in an additive manufacturing process to produce the workpiece having a meta-structure region comprising manifolds of tetrahedral elements (e.g., having four nodes, four faces), hexahedral elements, and/or fractal elements corresponding to those of the generated three-dimensional meta-structure model. In some embodiments, the first three-dimensional meta-structure sub-model corresponds to a first-level Meshagon as described herein. In other embodiments, the first three-dimensional meta-structure sub-model corresponds to a second-level Meshagon or an n-level Meshagon in which n is greater than one.

In some embodiments, the method further includes generating, by the processor, a second three-dimensional meta-structure sub-model (e.g., ML-2 sub-model) of a portion of the first three-dimensional meta-structure sub-model (e.g., ML-1 sub-model).

In some embodiments, the second three-dimensional meta-structure sub-model (e.g., ML-2 sub-model) is generated by identifying (e.g., a user-defined parameter or user-defined boundary), by the processor, the portion of the first three-dimensional meta-structure sub-model to be converted to the second three-dimensional meta-structure sub-model; converting, by the processor, a plurality of joints and linkages associated with the portion of the first three-dimensional meta-structure sub-model to a second finite element mesh structure, wherein the second finite element mesh structure comprises a plurality of interlinking linkages (e.g., edges) and joints (e.g., nodes) that collectively form a second three-dimensional manifold structure of tetrahedral, hexahedral, and/or fractal elements, wherein cross-sectional areas of the plurality of interlinking linkages and joints of the second finite element mesh structure are smaller than those of the first finite element mesh structure; and, varying, by the processor, the cross-sectional areas of each of the linkages and joints of the second finite element mesh structure according to a specified second profile; and, combining, by the processor, individual node-pairs of the first finite element mesh structure and second finite element mesh structure (e.g., wherein duplicate node-pairs between the first finite element mesh structure to the second finite element mesh structure are removed).

In some embodiments, each of the specified profile to produce the first three-dimensional meta-structure sub-model and the specified second profile to produce the second three-dimensional meta-structure sub-model is based on a pre-defined parameter or function. In some embodiments, the pre-defined parameter or function generates an interpolation of the parameter values between respective multi-level three-dimensional meta-structure that are generated.

In some embodiments, the method further includes generating, by the processor, a plurality of alpha meta-capsules (e.g., based on AlphaShapes) for the combined model of the first finite element mesh structure and the second finite element mesh structure.

In some embodiments, the method further includes generating, by the processor, a plurality of modified-alpha meta-capsules (e.g., based on modified AlphaShapes, i.e., "Meta-balls") for the combined model of the first finite element mesh structure and the second finite element mesh structure.

In some embodiments, the specified profile of each of the linkages and joints of the first three-dimensional meta-structure sub-model includes one or more geometric and/or topologic properties selected from the group consisting of a linkage (e.g., edge) thickness parameter, a joint (e.g., node) thickness parameter, a linkage length parameter, a joint chamfer parameter, a surface smoothness parameter, and a parameter associated with length-wise tapering of linkage (e.g., edge) strut.

In some embodiments, the specified profile of each of the linkages and joints of the second finite element mesh structure includes at least one of the linkage thickness parameter, the joint thickness parameter, and the linkage length parameter, wherein each associated value of the at least one of the linkage thickness parameter, the joint thickness parameter, and the linkage length parameter of the second finite element mesh structure is less than that of the first finite element mesh structure.

In some embodiments, each of the one or more geometric and/or topologic properties of the specified profile is user-definable. In some embodiments, the one or more geometric and/or topologic properties are applied to the object profile as extra-dimensional (e.g. 4D, 5D, etc.) parameters.

In some embodiments, a portion of the one or more geometric and/or topologic properties of the specified profile is defined from a user-defined parameter.

In some embodiments, the method further includes generating, by the processor, a third three-dimensional meta-structure sub-model (e.g., ML-3 sub-model) of a portion of the second three-dimensional meta-structure sub-model (e.g., ML-2 sub-model) by: identifying (e.g., a user-defined parameter or user-defined boundary), by the processor, a portion of the second three-dimensional meta-structure sub-model (e.g., ML-2 sub-model) to be converted to the third three-dimensional meta-structure sub-model (e.g., ML-3 sub-model); converting, by the processor, a plurality of joints and linkages associated with the portions of the second three-dimensional meta-structure sub-model (e.g., ML-2 sub-model) to a third finite element mesh structure (e.g., ML-3 sub-model), wherein the third finite element mesh structure comprises a plurality of interlinking linkages (e.g., edges) and joints (e.g., nodes) that collectively form a third three-dimensional manifold structure of tetrahedral, hexahedral, or fractal elements, wherein cross-sectional areas of the plurality of interlinking linkages and joints of the third finite element mesh structure are smaller than those of the first and second finite element mesh structures; varying, by the processor, the cross-sectional areas of each of the linkages and joints of the third finite element mesh structure according to a specified third profile; and, combining, by the processor, individual node-pairs of the first finite element mesh structure and second finite element mesh structure (e.g., wherein duplicate node-pairs between the first finite element mesh structure to the second finite element mesh structure are removed).

In some embodiments, the method further includes iteratively generating, by the processor, one or more N-domain three-dimensional meta-structure sub-models (e.g., ML-"N" sub-model) of a portion of a prior N−1 domain three-dimensional meta-structure sub-model (e.g., ML-"N−1" sub-model), wherein each N-domain three-dimensional meta-structure sub-model is generated by: identifying (e.g., a user-defined parameter or user-defined boundary), by the processor, a portion of the prior N−1 domain three-dimensional meta-structure sub-model to be converted to a given N-domain three-dimensional meta-structure sub-model; converting, by the processor, a plurality of joints and linkages associated with the portions of the prior N−1 domain three-dimensional meta-structure sub-model to a given N-domain finite element mesh structure, wherein the given N-domain finite element mesh structure comprises a plurality of interlinking linkages (e.g., edges) and joints (e.g., nodes) that collectively form a three-dimensional manifold structure of tetrahedral, hexahedral, or fractal elements, wherein cross-sectional areas of the plurality of interlinking linkages and joints of the given N-domain finite element mesh structure are smaller than those of the prior N−1 domain mesh structures; varying, by the processor, the cross-sectional areas of each of the linkages and joints of the given N-domain finite element mesh structure according to a specified profile; and, combining, by the processor, individual node-pairs of the N-domain finite element mesh structure and the prior N−1 domain finite element mesh structure (e.g., wherein duplicate node-pairs between the prior N−1 domain finite element mesh structure to the N-domain finite element mesh structure are removed).

In some embodiments, the workpiece comprise a thermoplastic selected from the group consisting of: hydroxyapatite, polyetheretherketone (PEEK), polyaryletherketone (PAEK), and other poly (ether ketone ketone) (PEKK).

In some embodiments, the workpiece comprises a thermoplastic selected from the group consisting of: acrylonitile butadiene styrene (ABS), polylactic acid (PLA), polyvinyl alcohol (PVA), polycarbonate, polyphenylene sulfide (PPS), polyetherimide (PEI), polyphenyl sulfone (PPSU), silicon, and polyether sulfone (PES), and a combinations thereof.

In some embodiments, the workpiece comprises a metal or alloy selected from the group consisting of: steel, stainless steel, titanium, gold, silver, nickel, cobalt, iron, bronze, refractory metal, aluminum, zirconium, and a combination thereof.

In some embodiments, the additive manufacturing process is selected from the group consisting of: powder bed fusion (e.g., selective laser sintering (SLS), selective laser melting (SLM), electron beam melting (EBM), direct metal laser sintering (DMLS)); Vat polymerization (e.g., laser-based stereolithography (SLA) and digital light processing (DLP)); material jetting (e.g., continuous or Drop on Demand (DOD)); binder jetting; material extrusion (e.g., fused deposition modeling (FDM)); and multi-jet fusion (MJF).

In some embodiments, the method further includes performing, by a processor, a structural finite element analysis of the first three-dimensional meta-structure sub-model; and, determining, by the processor, from the structural finite element analysis, whether the first three-dimensional meta-structure sub-model meets or not meet pre-defined structural limitations for the workpiece.

In another aspect, a non-transitory computer-readable medium is disclosed. The computer-readable medium having instructions stored thereon, wherein execution of the instructions by a processor, cause the processor to perform the steps recited in any one of the above method.

In another aspect, a system is disclosed comprising: a processor; and, a memory having instructions stored thereon, wherein execution of the instructions by the processor, cause the processor to perform the steps recited in any one of the above method.

In another aspect, a workpiece (e.g., a meta-structure workpiece) is disclosed that is generated by an additive manufacturing process of a three-dimensional meta-structure model prepared by a process comprising the steps of: obtaining or creating, by a processor, a source three-dimensional model (e.g., CAD solid model) of the workpiece; obtaining or creating, by the processor, a portion of the source three-dimensional model to convert to a first three-dimensional meta-structure sub-model (e.g., a Meshagon portion of the CAD model); and, generating, by the processor, a model of the workpiece having the first three-dimensional meta-structure sub-model (e.g., ML-1 sub-model) by: converting, by the processor, the portion of the source three-dimensional model to a first finite element mesh structure, wherein the first finite element mesh structure comprises a plurality of interlinking linkages (e.g., edges) and joints (e.g., nodes) that collectively form a three-dimensional manifold structure of tetrahedral, hexahedral, and/or fractal elements (e.g., pre-selected element types); and, varying, by the processor, cross-sectional areas of each of the linkages and joints of the first finite element mesh structure according to a specified profile (e.g., according a defined AlphaShape or a modified-AlphaShape (e.g., "Meta-balls")) to produce the first three-dimensional meta-structure sub-model.

In some embodiments, the workpiece is selected from the group consisting of: an biomedical implant; a mechanical frame component for an automobile; a mechanical frame component for an aerospace system (e.g., satellite, fixed-wing aircraft, rockets, missiles, gliders, rotorcraft); a mechanical frame component for a robotic system (e.g., in manufacturing); a mechanical frame component for an instrument; and, a mechanical frame component for an unmanned vehicle system.

In another aspect, a computer-implemented method is disclosed to generate a three-dimensional meta-structure model of a building. The method includes obtaining or creating, by a processor, a source three-dimensional model (e.g., CAD solid model, architectural model) of a building; obtaining or creating, by the processor, a portion of the source three-dimensional model to convert to a first three-dimensional meta-structure sub-model (e.g., a Meshagon portion of the CAD model); generating, by the processor, a model of the building having the first three-dimensional meta-structure sub-model (e.g., ML-1 sub-model) by: converting, by the processor, the portion of the source three-dimensional model to a first finite element mesh structure, wherein the first finite element mesh structure comprises a plurality of interlinking linkages (e.g., edges) and joints (e.g., nodes) that collectively form a three-dimensional manifold structure of tetrahedral, hexahedral, and/or fractal elements (e.g., pre-selected element types); and, varying, by the processor, cross-sectional areas of each of the linkages and joints of the first finite element mesh structure according to a specified profile (e.g., according a defined AlphaShape or a modified-AlphaShape (e.g., "Meta-balls")) to produce the first three-dimensional meta-structure sub-model; wherein the generated three-dimensional meta-structure model is used as a part of an architectural design for the building having a meta-structure region comprising manifolds of tetrahedral elements (e.g., having four nodes, four faces), hexahedral elements, and/or fractal elements corresponding to those of the generated three-dimensional meta-structure model.

In some embodiments, the workpiece is selected from the group consisting of: an biomedical implant; a mechanical frame component for an automobile; a mechanical frame component for an aerospace system; a mechanical frame component for a robotic system; a mechanical frame component for an instrument; and a mechanical frame component for an unmanned vehicle system.

In some embodiments, the workpiece includes a second three-dimensional meta-structure of a portion of the first three-dimensional meta-structure sub-model, and wherein the source three-dimensional model corresponds to a building component for walls, pavement, and/or masonry construction.

In some embodiments, the workpiece comprises a material selected from the group consisting of: hydroxyapatite, polyetheretherketone (PEEK), polyaryletherketone (PAEK), other poly (ether ketone ketone) (PEKK), acrylonitile butadiene styrene (ABS), polylactic acid (PLA), polyvinyl alcohol (PVA), polycarbonate, polyphenylene sulfide (PPS), polyetherimide (PEI), polyphenyl sulfone (PPSU), polyether sulfone (PES), silicon, steel, stainless steel, titanium, gold, silver, nickel, cobalt, iron, bronze, refractory metal, aluminum, zirconium, and a combination thereof.

BRIEF DESCRIPTION OF THE DRAWINGS

The accompanying drawings, which are incorporated in and constitute a part of this specification, illustrate embodiments and together with the description, serve to explain the principles of the methods and systems. The patent or application file contains at least one drawing executed in color. Copies of this patent or patent application publication with color drawing(s) will be provided by the Office upon request and payment of the necessary fee.

Embodiments of the present invention may be better understood from the following detailed description when read in conjunction with the accompanying drawings. Such embodiments, which are for illustrative purposes only, depict novel and non-obvious aspects of the invention. The drawings include the following figures:

FIG. 9A shows a diagram of an original 3D model of a landing gear workpiece.

FIGS. 9B, 9C, and 9D show different views of a converted model of the landing gear model of FIG. 9A with a three-dimensional meta-structure incorporated therein in accordance with an illustrative embodiment.

DETAILED DESCRIPTION

Each and every feature described herein, and each and every combination of two or more of such features, is included within the scope of the present invention provided that the features included in such a combination are not mutually inconsistent.

It is understood that throughout this specification the identifiers "first", "second", "third", "fourth", "fifth", "sixth", and such, are used solely to aid in distinguishing the various components and steps of the disclosed subject matter. The identifiers "first", "second", "third", "fourth", "fifth", "sixth", and such, are not intended to imply any particular order, sequence, amount, preference, or importance to the components or steps modified by these terms.

Figure 1:
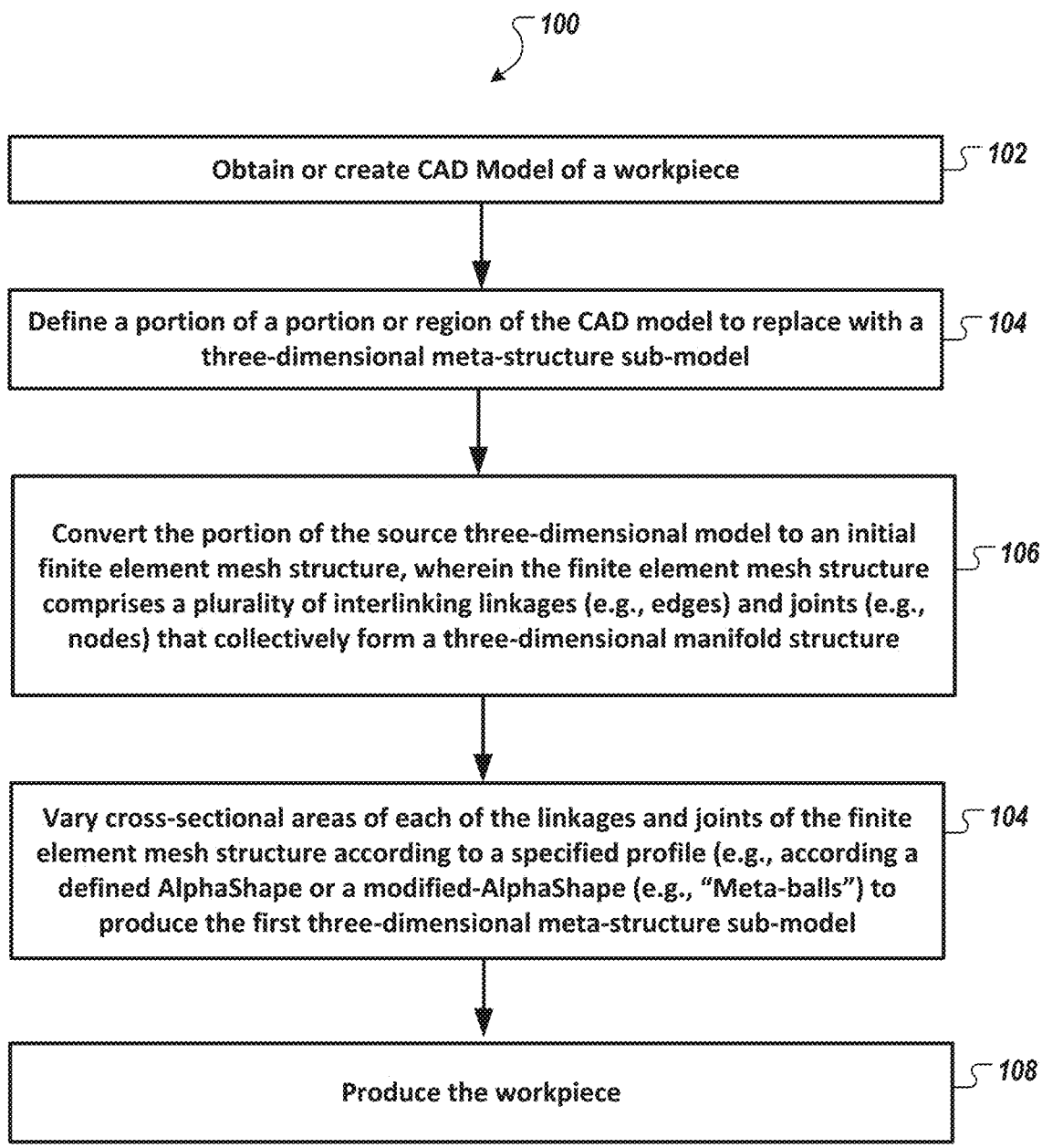
FIG. 1 is a flow diagram of a method to generate a three-dimensional meta-structure model of a workpiece for use in an additive manufacturing process in accordance with an illustrative embodiment.

FIG. 1 is a flow diagram of a method 100 to generate a three-dimensional meta-structure model (not shown, see FIGS. 2A-2C) of a workpiece for use in an additive manufacturing process in accordance with an illustrative embodiment. In FIG. 1, the method 100 includes obtaining or creating (step 102), by a processor of a system, a source three-dimensional model of a workpiece. In some embodiments, the source three-dimensional model is a CAD solid model, a computed tomography-based (CT) model, a stereolithographic (STL) model, and the like. The CAD solid model can be created using CAD software. Examples of CAD software include SolidWorks (Dassault Systèmes, Vélizy-Villacoublay, France), Fusion 360 (Autodesk, San Rafael, Calif.), Blender3D (Blender Foundation, Amsterdam, Netherlands), etc.

The method 100 then includes defining (step 104) a portion or region of the CAD model to be replaced with a three-dimensional meta-structure sub-model. In some embodiments, the entire CAD model is designated to be converted to the three-dimensional meta-structure sub-model. In other embodiments, a development system allows a user to define boundaries within the CAD solid model to be replaced with the three-dimensional meta-structure sub-model. In some embodiments, the boundaries are defined by one or two parameters that are selectable by the user (e.g., a radial value and a shape type).

Figure 2C:
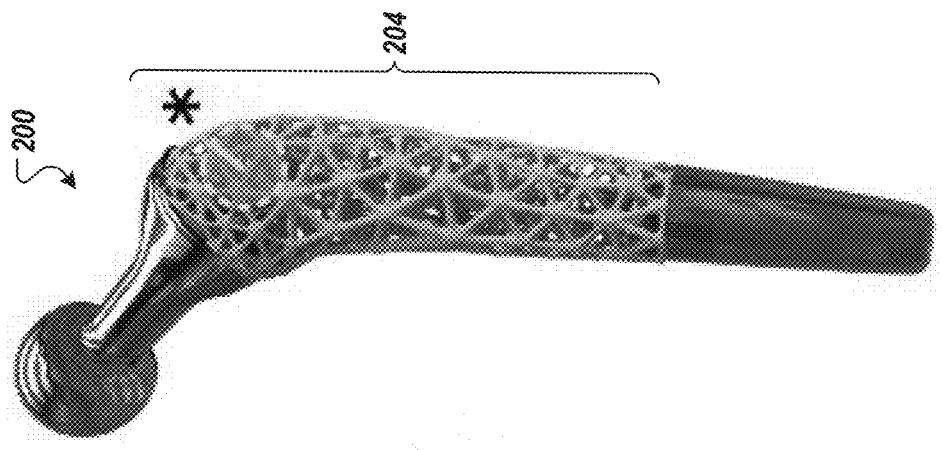
FIGS. 2A, 2B, 2C show the generation of a three-dimensional meta-structure sub-model from a corresponding source three-dimensional model in accordance with an illustrative embodiment.

The method 100 then includes generating (step 106) a finite element mesh of defined portion of the CAD model by converting surfaces and volumes of the CAD model to a set of interlinking linkages (e.g., edges) and joints (e.g., nodes) using a meshing operation. Mesh generation is an operation of generating a polygonal or polyhedral mesh that approximates a geometric domain. In some embodiments, the initial mesh is generated by well-established mesh generation tools, such as those used in SolidWorks (Dassault Systèmes) and Matlab. In FIG. 2C, a tetrahedral mesh is shown, but the mesh can be of other types, such as hexahedral, fractal, or a hybrid combination of these mesh types.

The generated mesh includes a list of nodes and elements in which the nodes are numbered in a sequence, each defined by three spatial coordinates, e.g., [x, y, z], and the elements are each defined to have a pre-defined set of nodes. For a tetrahedral element, each element has four nodes, e.g., [n1, n2, n3, n4]. In some embodiments, from the list of nodes and elements, a full object sequence of node-edge pairs can be computed. That is, all of the node position and connecting lines (i.e., edges or links) are computed. Adjacent tetrahedral would share node-edges and such redundant edge-pairs are removed from the list of nodes and elements.

Edges can be maintained or deleted from the list, as needed or desired. In some embodiments, portions of the list of nodes and elements are re-meshed based on a parameter and combined to the list of nodes and elements. In some embodiments, the mesh generation tool is optimized to generate a mesh structure with tetrahedrons having angles that are above a pre-defined threshold. In other embodiments, the mesh generation tool is configured to remove mesh elements that would produce poor structural elements of the workpiece. In some embodiments, the mesh generation tool is configured to remove these poor mesh elements by identify mesh elements (e.g., individual tetrahedrons) that are generally flat and then either combining these mesh elements with neighbor elements or to re-meshing the mesh element into sub-mesh elements having angles that are above a pre-defined threshold.

The method 100 then includes varying (step 108) cross-sectional areas of each of the linkages and joints of the first finite element mesh structure according to a specified profile (e.g., according a defined AlphaShape or a modified-AlphaShape (e.g., "Meta-balls") to produce the first three-dimensional meta-structure sub-model. In some embodiments, for each link, an AlphaShape of the link is generated in which the thickness is defined by a single parameter for a length of the link. And, for each joint (i.e., node), a modified-AlphaShape is computed. All the modified-AlphaShape are then combined, e.g., in a linear interpolation operation (e.g., cross-fade) to produce a mean-surface. The interpolation can be varied to produce a thinner or thicker structure. Other types of interpolation can be used. In some embodiments, non-linear transitional interpolations is used.

An AlphaShape is generally an implicit representation of a surface and is defined, in some embodiments, as a distance from a primitive object (also referred to as a distance function). Indeed, the AlphaShape of a point can be characterized as a three-dimensional sphere, and the AlphaShape of a line (e.g., of a finite-element mesh) can be characterized as an elongated cylinder having a length corresponding to that line. Additional description of AlphaShapes can be found at Edelsbrunner, Muecke; Three dimensional alpha shapes, ACM Trans on Graphics (1994), which is incorporated by reference herein in its entirety. The modified-AlphaShape (e.g., "Meta-balls") is an extension of the Alpha Shape in which the boundary is defined by a function, rather than a single number. In some embodiments, the function is a Gaussian function.

In some embodiments, thicknesses of individual struts and joints, chamfer angle (i.e. transitions), local and global density-porosity, and optimizing local stresses, and, vibrations are parameters that can be received as inputs to a process that iteratively modify the respective three-dimensional meta-structure sub-model until a set of pre-defined requirements for the workpiece is achieved. Because the modification may not converge to a single solution, the output of step 108 may be considered a snapshot of a three-dimensional meta-structure sub-model as it is continuously being modified. Indeed, the finite-element meshes are 'optimized' using such iterative techniques to best represent requirements of the part.

Examples of additive manufacturing systems includes those manufactured by Hewlett Packard Inc. (e.g., the Hewlett Packard, Jet Fusion 3D), Sandia National Laboratories (e.g., the LENS: Laser Engineered Net Shaping), and 3DSystems Inc., that use selective laser sintering to produce parts in various engineering materials with precise shape and structure. In some embodiments, the additive manufacturing process can use, or be based on, powder bed fusion (e.g., selective laser sintering (SLS), selective laser melting (SLM), electron beam melting (EBM), direct metal laser sintering (DMLS)); Vat polymerization (e.g., laser-based stereolithography (SLA) and digital light processing (DLP)); material jetting (e.g., continuous or Drop on Demand (DOD)); binder jetting; material extrusion (e.g., fused deposition modeling (FDM)); and multi-jet fusion (MJF).

The exemplified three-dimensional meta-structure model can be manufactured as a workpiece in a variety of material available in additive manufacturing processes, ranging from thermoplastics and thermoset to metals and alloys. In some embodiments, the workpiece comprise a thermoplastic selected from the group consisting of: hydroxyapatite, polyetheretherketone (PEEK), polyaryletherketone (PAEK), and other poly (ether ketone ketone) (PEKK). In some embodiments, the workpiece comprise a thermoplastic selected from the group consisting of: acrylonitrile butadiene styrene (ABS), polylactic acid (PLA), polyvinyl alcohol (PVA), polycarbonate, polyphenylene sulfide (PPS), polyetherimide (PEI), silicon, polyphenyl sulfone (PPSU), and polyether sulfone (PES), and a combinations thereof. In some embodiments, the workpiece comprises a metal or alloy selected from the group consisting of: steel, stainless steel, titanium, gold, silver, nickel, cobalt, iron, bronze, refractory metal, aluminum, zirconium, and a combination thereof.

Figure 2B:
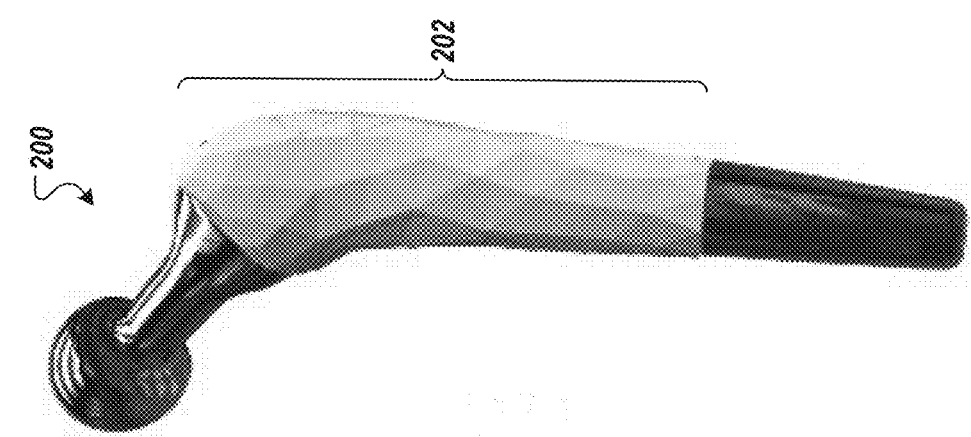
Figure 2A:
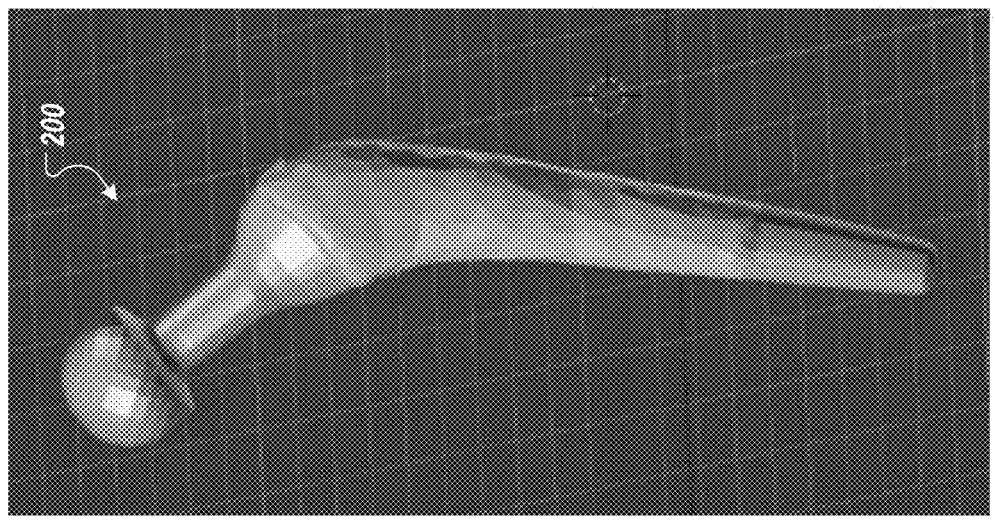

FIGS. 2A, 2B, 2C show the generation of a three-dimensional meta-structure sub-model from a corresponding source three-dimensional model in accordance with an illustrative embodiment. In FIG. 2A, an example source three-dimensional model 200 of a femoral bone implant is shown having been generated in a CAD modeling tool. In FIG. 2B, a region 202 of the source three-dimensional model 200 of FIG. 2A is converted to a finite element mesh structure. As shown, the finite element mesh structure comprises a plurality of tetrahedral elements. In some embodiments, the finite element mesh structure are generated with hexahedral or fractal elements. In FIG. 2C, a three-dimensional meta-structure sub-model 204 is shown generated from the finite element mesh structure of FIG. 2B in which cross-sectional areas of each of the linkages and joints of the finite element mesh structure are varied according to a specified profile in accordance with an illustrative embodiment.

It is observed that exemplified three-dimensional meta-structure (i.e., Meshagons) can dramatically reduce part weight/density (in some embodiments, up to 50% or more) while still retaining high functional strength.

Further, the exemplified three-dimensional meta-structure provides multiply-defined densities and/or porosities that can be of further benefits, such as in improving bone in-growth and improving of the stability of the implant.

Figure 3A:
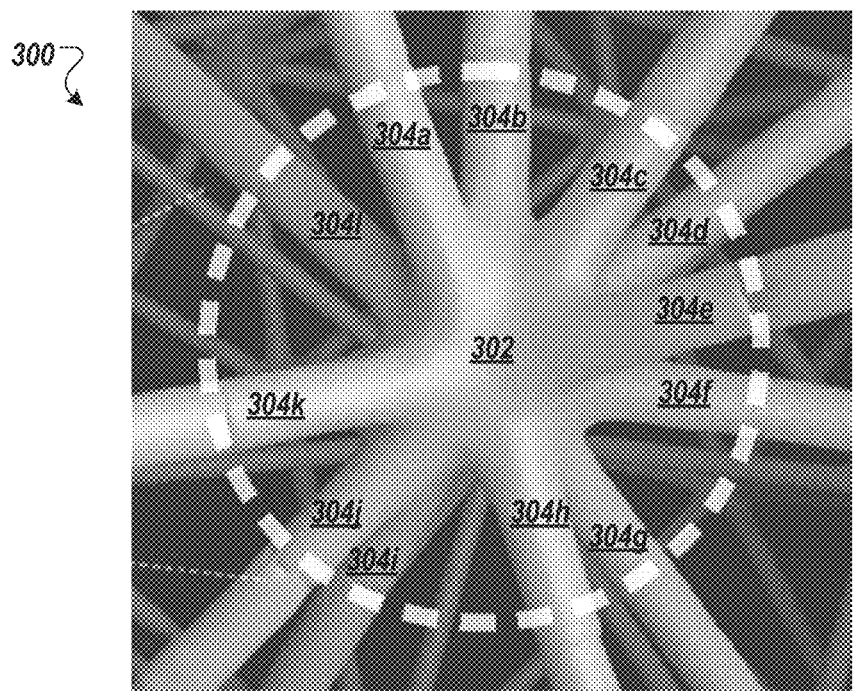
FIG. 3A is a detailed diagram of a generated joint of a three-dimensional meta-structure sub-model in accordance with an illustrative embodiment.
Figure 3B:
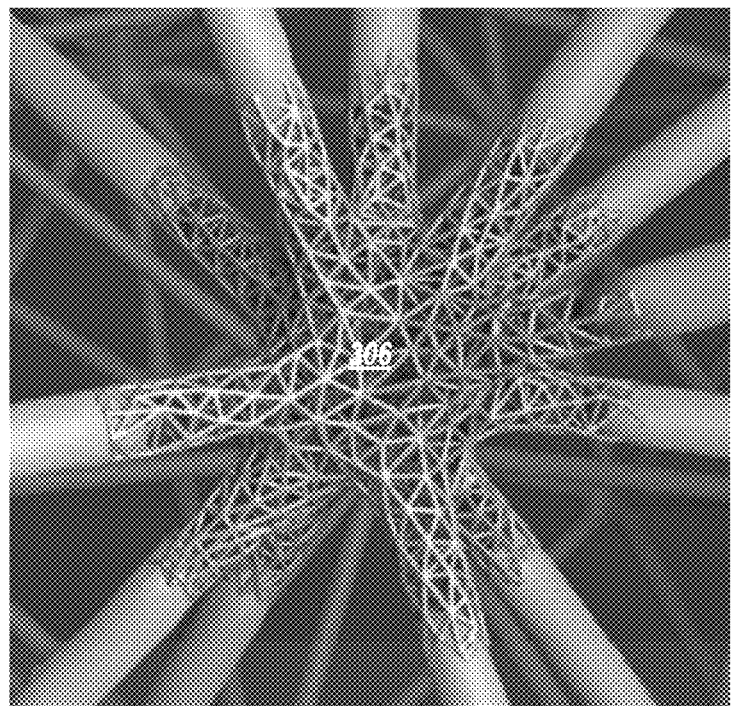
FIG. 3B is a detailed diagram of the generated joint of a three-dimensional meta-structure sub-model (e.g., a Level-1 "L1" sub-model) of FIG. 3A in which a joint and linkage portion of the meta-structure sub-model is replaced by another meta-structure sub-model (e.g., a Level-2 "L2" sub-model) in accordance with an illustrative embodiment.

In another aspect, a second three-dimensional meta-structure can be generated within the first three-dimensional meta-structure. FIGS. 3A and 3B shows the generation of a second three-dimensional meta-structure within the first three-dimensional meta-structure in accordance with an illustrative embodiment. In FIG. 3A, a generated joint 300 of a three-dimensional meta-structure sub-model generated in accordance with the process described in relation to FIG. 1 is shown. The joint 300 include joint portion 302 that connects to a plurality of links (shown as 304a-304l. In FIG. 3B, the same generated joint of FIG. 3A (e.g., referred to as a "L1 sub-model") is replaced by a meta-structure sub-model 306 (e.g., an "L2 sub-model") of the joint 302 and linkage portions 304a-304l. The meta-structure sub-model 306 is composed of a plurality of tetrahedral elements having four triangular faces, six straight edges, and four vertex corners.

FIGS. 4A, 4B, 4C, and 4D illustrate an exemplary method to vary the cross-sectional areas of the linkages and joints of the finite element mesh structure according to a specified profile as described in relation to FIG. 1.

Figure 4A:
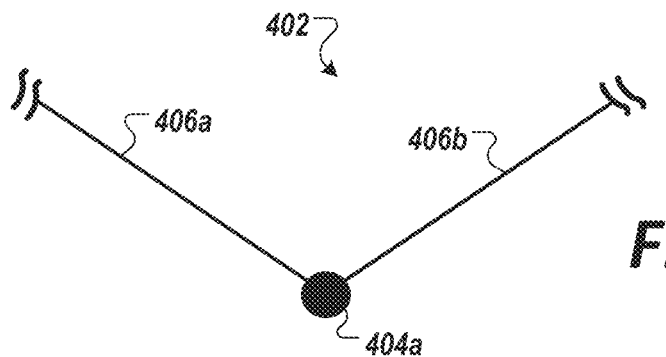
FIGS. 4A, 4B, 4C, and 4D illustrate an exemplary method to vary the cross-sectional areas of the linkages and joints of the finite element mesh structure according to a specified profile as described in relation to FIG. 1 in accordance with an illustrative embodiment.

In FIG. 4A, a simplified diagram 402 of a single joint (shown as joint 404a) and interlinking linkages (shown as linkages 406a, 406b) is shown.

Figure 4B:
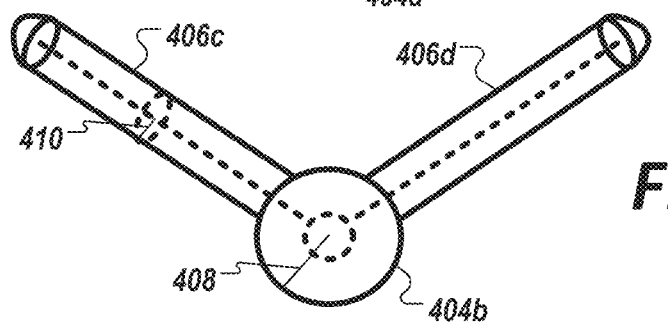

In FIG. 4B, the joint 404a is shown varied with a cross-sectional area value 408 defined by a joint thickness parameter to generate a resized joint 404b, and each of the links 406a, 406b are varied in thickness per a single link-thickness parameter 410 to generate resized joints 406c, 406d. In some embodiments, the joint thickness parameter 408 and the link thickness parameter 410 are the same, or are associated to each other in that a single value can be used to derive the two parameters.

Figure 4C:
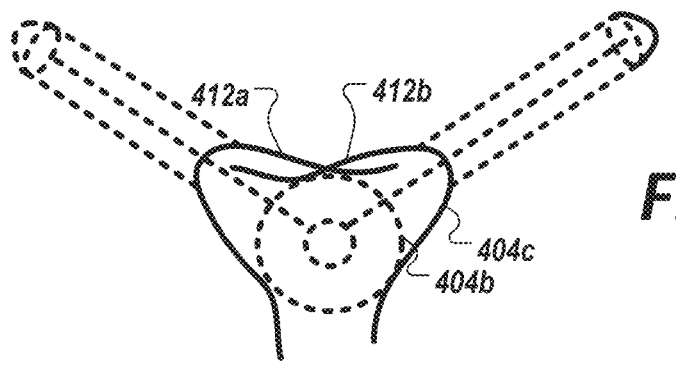

In FIG. 4C, a three-dimensional Gaussian-based surface 412a, 412b is applied to each of the re-sized joint 404b to generate a modified surface 404c of the joint 404b in which each peak of the Gaussian-based surface 410a, 410b is aligned to a respective axis associated with the resized linkages 406c, 406d. In some embodiments, the Gaussian surface 412a, 412b is applied with the joint 404a without the joint 404a having to be first resized.

Figure 4D:
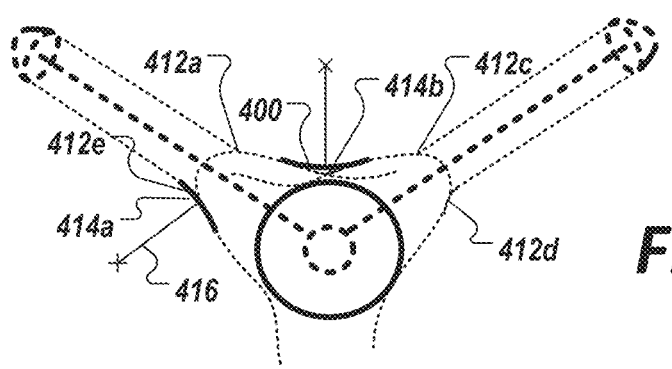

In FIG. 4D, a chamfer surface (shown as 414a, 414b) can be added to each of the connecting regions (shown as 412a, 412b, 412c, 412d, 412e) between the resized linkages 406c, 406d and the modified joint 404c. In FIG. 4D, only two chamber surfaces are shown, though as indicated, a chamfer surface can be added to each of the connecting regions.

Indeed, thicknesses of individual struts and joints, chamfer angle (i.e. transitions), local and global density-porosity, optimized local stresses, and vibrations are parameters that can be received as inputs to the three-dimensional meta-structure generation process.

Figure 5:
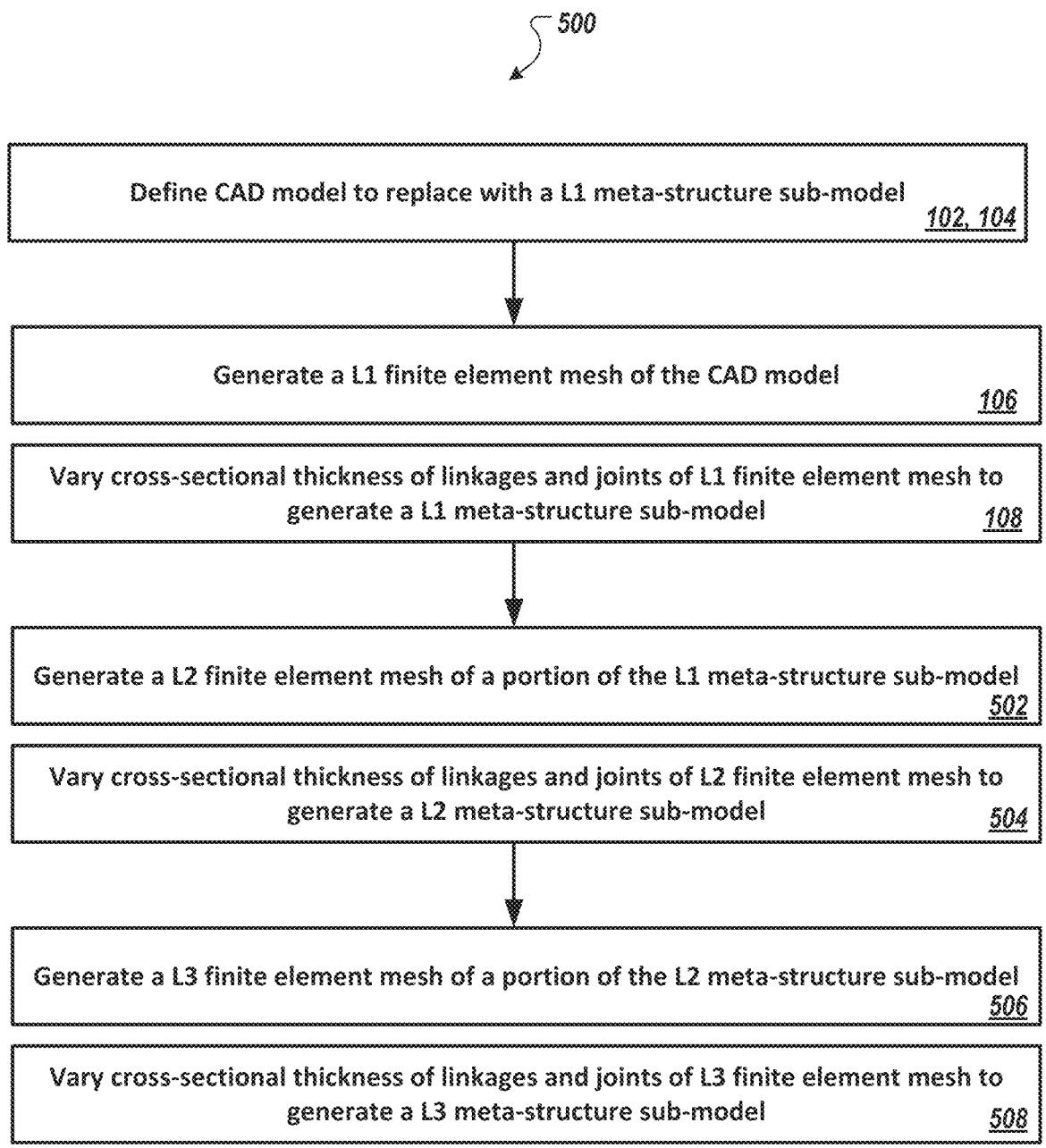
FIG. 5 is a flow diagram of a method to iteratively generate a three-dimensional meta-structure model of a workpiece for use in an additive manufacturing process in which the three-dimensional meta-structure model has finer three-dimensional meta-structures therein in accordance with an illustrative embodiment.

FIG. 5 is a flow diagram of a method 500 to iteratively generate a three-dimensional meta-structure model of a workpiece for use in an additive manufacturing process in which the three-dimensional meta-structure model has finer three-dimensional meta-structures therein in accordance with an illustrative embodiment.

The method 500 includes generating a first three-dimensional meta-structure sub-model by defining (steps 102, 104) a CAD model to replace with a L1 meta-structure sub-model, generating (step 106) a Level-1 "L1" finite element mesh of the CAD model, and varying (step 108) the cross-sectional areas of each of the linkages and joints of the first finite element mesh structure according to a specified profile (e.g., according a defined AlphaShape or a modified-AlphaShape (e.g., "Meta-balls") to produce the first three-dimensional meta-structure sub-model.

In some embodiments, a marching-cube algorithm is used to computer a triangular surface of the meshed elements.

The method 500 then includes generating a second three-dimensional meta-structure sub-model (e.g., a second-level Meshagon) of the first three-dimensional meta-structure sub-model (e.g., a first-level Meshagon). The second three-dimensional meta-structure sub-model can be generated to replace the entire first three-dimensional meta-structure sub-model or a portion thereof. The portion may be defined parametrically, for example, based on a distance from the center of the node of the first three-dimensional meta-structure sub-model. In other embodiments, a volume of the first three-dimensional meta-structure sub-model is defined by a user that can be replaced by the first three-dimensional meta-structure sub-model. In other embodiments, the volume of the first three-dimensional meta-structure sub-model can be determined based on simulations performed to evaluate the strength and mechanical properties of the workpiece.

In FIG. 5, the method 500 to generate a model of a workpiece having the second three-dimensional meta-structure sub-model includes identifying (e.g., a user-defined parameter or user-defined boundary), by the processor, the portion of the first three-dimensional meta-structure sub-model to be converted to the second three-dimensional meta-structure sub-model; converting (step 502), by the processor, a plurality of joints and linkages associated with the portion of the first three-dimensional meta-structure sub-model to a second finite element mesh structure in which the second finite element mesh structure comprises a plurality of interlinking linkages (e.g., edges) and joints (e.g., nodes) that collectively form a second three-dimensional manifold structure; and, varying (step 504), by the processor, the cross-sectional areas of each of the linkages and joints of the second finite element mesh structure according to a specified second profile. The method 500 may include combining, by the processor, individual node-pairs of the first finite element mesh structure and second finite element mesh structure (e.g., wherein duplicate node-pairs between the first finite element mesh structure to the second finite element mesh structure are removed).

In some embodiments, individual node-pairs from the first and second three-dimensional meta-structure sub-models are shared at a boundary to generate the second three-dimensional meta-structure sub-model. In some embodiments, a polygonal boundary (e.g., a spherical boundary) is placed around each joint-center. Individual edge-node pairs associated with the first three-dimensional meta-structure sub-model and located within the polygonal boundary are then deleted and replaced with a corresponding edge-node pairs associated with the second three-dimensional meta-structure sub-model. An alpha meta-capsules is then computed for the first three-dimensional meta-structure sub-model and second three-dimensional meta-structure sub-model. This step can be repeated for any additional three-dimensional meta-structure sub-model that is generated.

Other methods of combining the model may be employed. In some embodiments, a Boolean operation is used to combine the three-dimensional meta-structure sub-models.

Indeed, n-number of meta-structures can be produced using the technique as described in relation to steps 502 and 504. In FIG. 5, a third three-dimensional meta-structure sub-model is further shown generated to replace portions of the second three-dimensional meta-structure sub-model. The workpiece having the third three-dimensional meta-structure sub-model may be generated by identifying (e.g., a user-defined parameter or user-defined boundary), by the processor, the portion of the second three-dimensional meta-structure sub-model to be converted to the third three-dimensional meta-structure sub-model; converting (step 506), by the processor, a plurality of joints and linkages associated with the portion of the second three-dimensional meta-structure sub-model to a third finite element mesh structure in which the third finite element mesh structure comprises a plurality of interlinking linkages (e.g., edges) and joints (e.g., nodes) that collectively form a third three-dimensional manifold structure; and, varying (step 508), by the processor, the cross-sectional areas of each of the linkages and joints of the third finite element mesh structure according to a specified third profile. The method 500 may include combining, by the processor, individual node-pairs of the second finite element mesh structure and third finite element mesh structure (e.g., wherein duplicate node-pairs between the second finite-element mesh structure to the third finite element mesh structure are removed).

In some embodiments, Meshagon description (that is, rules or profiles to be used to generate a given structure) has multiple spatial and time dimension capabilities. That is, the generation of a second three-dimensional meta-structure sub-model and any subsequent level three-dimensional meta-structure sub-model can be governed by rules or one or more parametric definitions and descriptions. Each parametric definitions and descriptions can be considered as an additional dimensional aspect of the three-dimensional volumetric object. Indeed, physically-relevant, 4+multi-dimensional structures and fields can be described.

In some embodiments, one or more linear or non-linear functions are used to control and/or vary Meshagon parameters on a level-by-level (multi-dimensional) basis, particularly, in the generation of lower sub-models. For example, a linear function can be used to define a strut AlphaShape radius, linearly or non-linearly, depending on a given Meshagon level. Another example of a linear function is to define a parameter such as the distance to the boundary of the object. Yet, another example of a linear function is to define a parameter based upon the length of the strut (longer struts are thicker, or thinner, etc.).

In some embodiments, the parameter value is applied to a sub-level model by defining a linear function, e.g., thickness=K*level. In another embodiment, the parameter value is applied to a sub-level model by defining a non-linear function, e.g., thickness=$K^2$*level. Other desired function, simple and/or complex, can be used.

In addition to physical, geometric, or topographic relationships, time-dimensional parameters can be used in the generation of a multi-level three-dimensional meta-structure sub-model (e.g., Meshagon).

In some embodiments, the time-dimension is considered as a 4th dimension of an object in which a pre-defined amount of 'real-time' is used as a means to transition of computed parameters. In other embodiments, the concept of 'pseudo-time' is used in which any desired user-defined transition dynamics and granularity is specified in the generation of a multi-level three-dimensional meta-structure sub-model.

In some embodiments, the multi-level three-dimensional meta-structure sub-model can have multiple time dimensions in which different properties of the various multi-level three-dimensional meta-structure sub-model are assigned to different time scales. Multiple properties (e.g. large-scale material parameters) could for example be grouped together and assigned one time scale, while smaller scale properties (e.g. molecular, atomic, quantum) could be grouped and assigned to another (or several) different time scale(s). Indeed, parametric definitions that are adjustable per a time-dimension provide an eloquent and powerful description of a multi-dimensional multi-time enabled structure that is revolutionary.

Because multi-dimensional multi-time enabled structure are inherently, by its definition, multi-scale meta-structures; time can be defined as any function of scale, linear or nonlinear. For example, smaller scale (molecular size Meshagon $2^{nd}$-$4^{th}$ or other levels) could exist at a fast time (that is, as a frequency response to a certain harmonics), but with larger scale structures (fibers, etc.) existing at slower time (e.g., having a frequency response to another set of harmonics), which can be defined for instance as a simple linear or nonlinear function of Meshagon 'level' scale. To this end, a multi-dimensional multi-time enabled structure can be programmed to vary in geometric and topologic features according to a desired wide-frequency (or narrow frequency) vibration absorbing or amplifying spectrum properties.

In addition to time-based parameters, other parameters based on material or mechanical properties can be used. Assignment of a parameter can affect the shape of three-dimensional meta-structure sub-model. In some embodiments, a thickness parameter can be applied at a node, and some other parameter can be applied at or along a strut, (e.g. midpoint, etc.).

In some embodiments, parameters based a non-physical property such as manufacturing or material cost can be used. Indeed, the cost of a material with certain defined density and stress-strain behavior certainly has a number of non-physical properties. Another non-physical property is aesthetics. A super-smooth transitioning three-dimensional meta-structure sub-model can be desired in certain designs.

Experimental Results

Figures 6A, 6B:
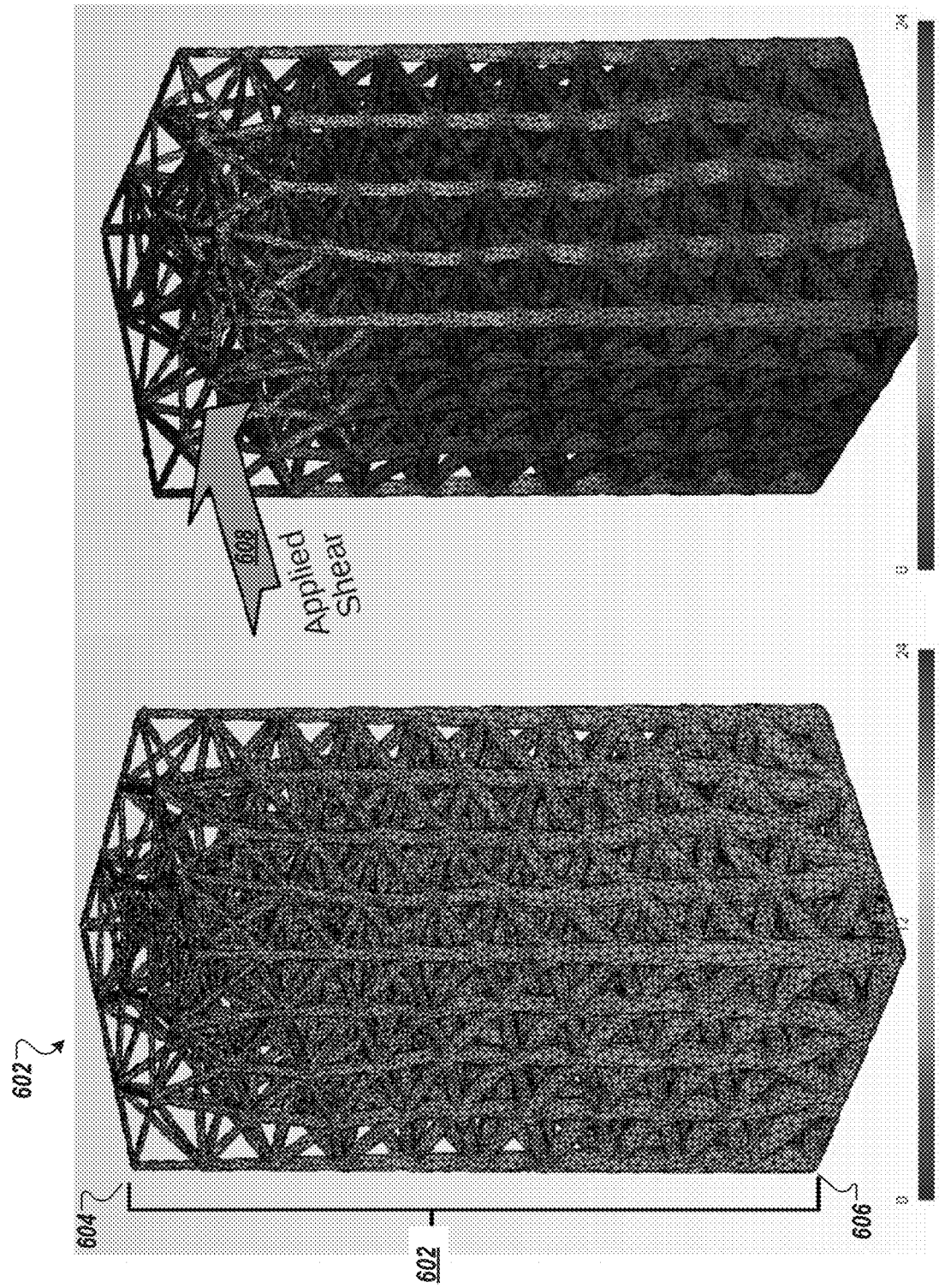
FIGS. 6A and 6B are results of a finite element stress analysis of a three-dimensional meta-structure model of a workpiece generated from a CAD model in accordance with an illustrative embodiment.

FIGS. 6A and 6B are results of finite element stress analysis of a three-dimensional meta-structure model of a workpiece generated from a CAD model in accordance with an illustrative embodiment. Indeed, FIGS. 6A and 6B optimization of structural and material use is shown.

In FIG. 6A, an example three-dimensional meta-structure model 602 generated from a CAD model of a rectangular beam is shown. The three-dimensional meta-structure has a gradient thickness along the Z-direction along the length 602 that is shown decreasing from the top portion 604 to the bottom portion 606 of the structure. The optimization and edge width control capabilities of the process described herein produces a smooth increase of strut thickness.

Other basis or profile for optimizing the structure can be applied in a similar fashion the parameter used to generate the gradient thickness shown here. Examples of such basis include scalar and field parameters such as strain energy levels, distance from a boundary surface and/or edges, radial distance from a point (i.e., spherical), and desired strut thickness range, etc.

In FIG. 6B, a ramping transverse shear load 608 is shown being applied to the three-dimensional meta-structure model 602 of FIG. 6A. The three-dimensional meta-structure model as a CAD model can be directly analyzed via finite element analysis. In FIG. 6B, high stresses appear near the load application, as expected, and gradually equalize near the base. This is an important feature of three-dimensional meta-structure model (Meshagons). The original rectangular beam model if applied with a similar load would show additional high peak stresses at the base and other regions of the beam.

In another aspect, the three-dimensional meta-structure can provide additional vibration damping behavior. As shown in FIG. 6B, the three-dimensional meta-structure can be generated with specified geometries tailored to dampen critical vibration spectra. Because the three-dimensional meta-structure is a true meta-structure, different ML-1, 2, 3, n levels can also be tuned for a specific frequency response properties that can augment one another. This meta-vibration dampening capability can exceed that of non-meta structure. Furthermore, since three-dimensional meta-structure are essentially open-cell porous, once produced, the workpiece can be filled with oil, silicon, or other material to improve dampening.

Figure 7:
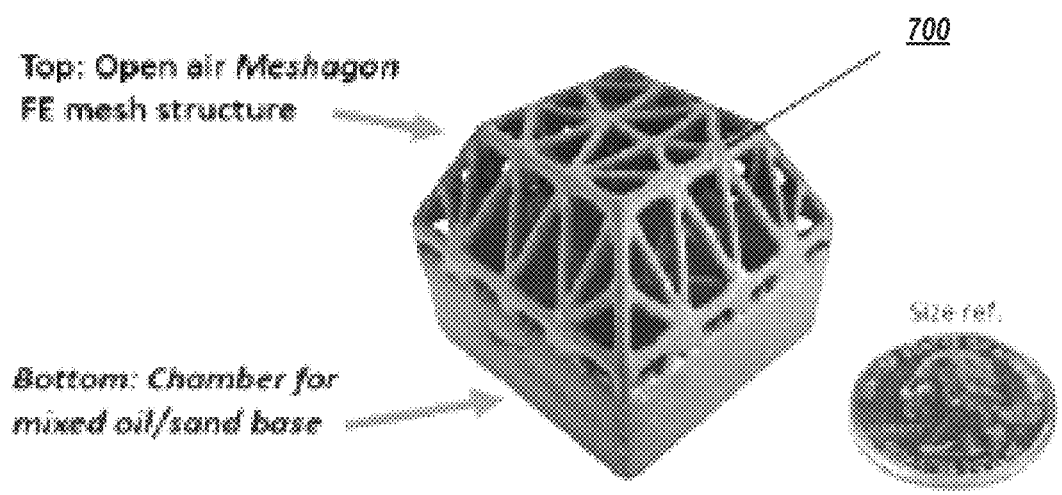
FIG. 7 is a photograph of a workpiece comprising a vibration isolating foot-piece having a three-dimensional meta-structure in accordance with an illustrative embodiment.

FIG. 7 is a photograph of a workpiece 700 comprising a vibration isolating foot-piece having a three-dimensional meta-structure. The structure was partially-optimized for vibration reduction of approximately 25-200 Hz (bass frequencies).

Example Workpiece with Three-Dimensional Meta-Structure

Figures 8A, 8B:
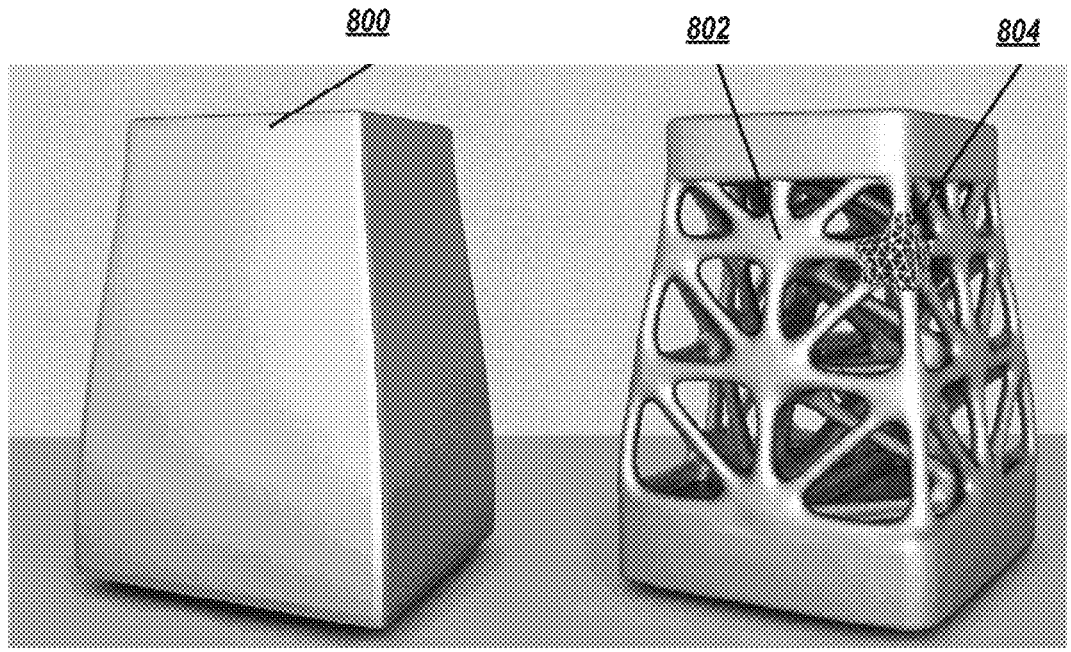
FIGS. 8A, 8B, 8C, and 8D shows progression of the generation of a multi-level three-dimensional meta-structure of a CAD model of a workpiece in accordance with an illustrative embodiment.
Figures 8C, 8D:
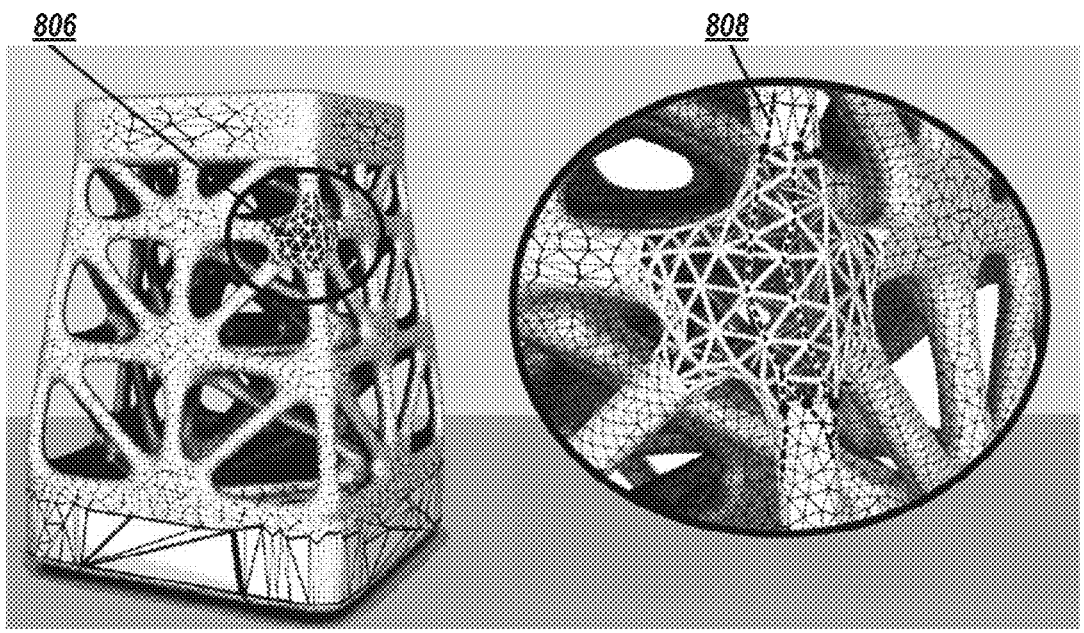

FIGS. 8A, 8B, 8C, and 8D shows progression of the generation of a multi-level three-dimensional meta-structure of a CAD model 800 of a workpiece. In FIG. 8A, a source CAD model 800 comprising an outer solid object shell is shown. In FIG. 8B, a first three-dimensional meta-structure sub-model 802 of a CAD model 800 is shown. The first three-dimensional meta-structure sub-model 802 includes a second three-dimensional meta-structure sub-model 804 as a replacement for one of the joints. FIG. 8C shows a finite element model of the generated workpiece of FIG. 8B.

FIG. 8D shows a detailed view of the second three-dimensional meta-structure sub-model 804 of FIG. 8C. Indeed, the second three-dimensional meta-structure sub-model 804 conforms to the nodes of the first three-dimensional meta-structure sub-model 802. Dashed lines 808 show how the second three-dimensional meta-structure sub-model 804 smoothly transitions, level-to-level, from first three-dimensional meta-structure sub-model 802. These transitions and related interpolations between the levels to form a continuous multi-level Meshagon structure is a result of the Meshagon multi-level generation process in that the nodes for the multi-level Meshagon are matched. As noted, other interpolation methods be implemented such a simple linear 'cross-fade' or non-linear transitional interpolations, among others.

FIGS. 9-18 show examples of various types of experimental workpieces that have been created having three-dimensional meta-structures.

FIG. 9A shows a diagram of an original 3D model 902 of a landing gear workpiece. FIGS. 9B, 9C, and 9D show different views of a converted model 904 of the landing gear model of FIG. 9A with a three-dimensional meta-structure 904 incorporated therein.

Figure 10:
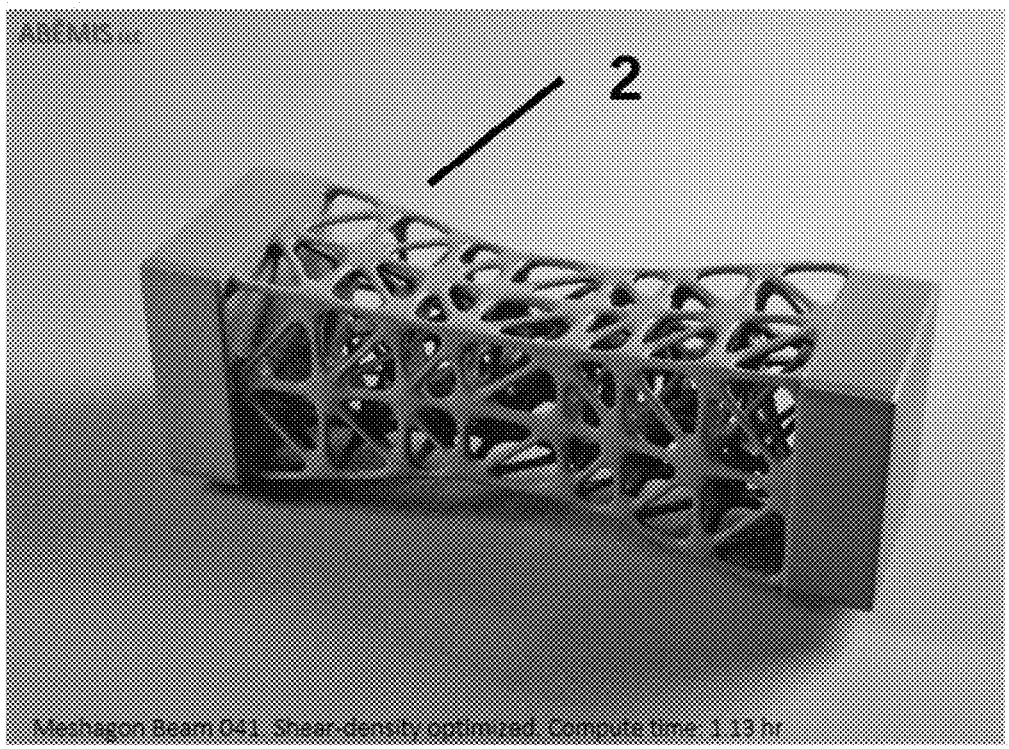
FIG. 10 shows a model of an example vibration dampening strut (optimized to be ultra-light) with connected attachment plates converted to a three-dimensional meta-structure in accordance with an illustrative embodiment.

FIG. 10 shows a model of an example vibration dampening strut (optimized to be ultra-light) with connected attachment plates converted to a three-dimensional meta-structure.

Figure 11:
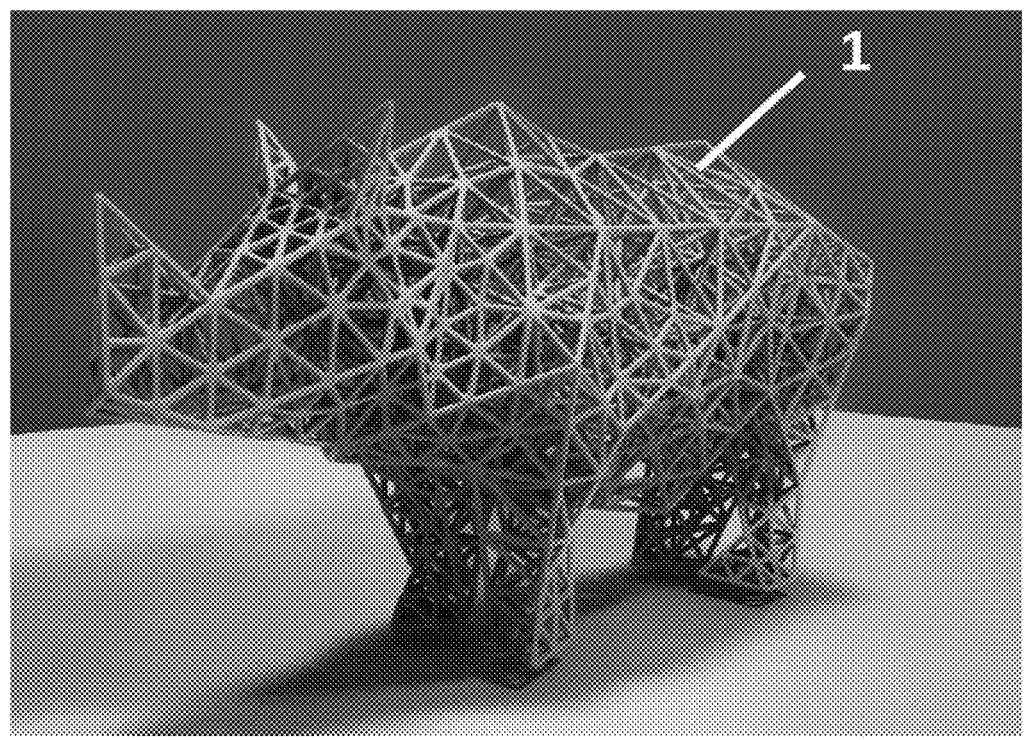
FIG. 11 shows a free-form geometric model of a Low Poly Rhino Meshagon that is converted to a three-dimensional meta-structure model in accordance with an illustrative embodiment.

FIG. 11 shows a free-form geometric model of a Low Poly Rhino Meshagon that is converted to a three-dimensional meta-structure model.

Figure 12:
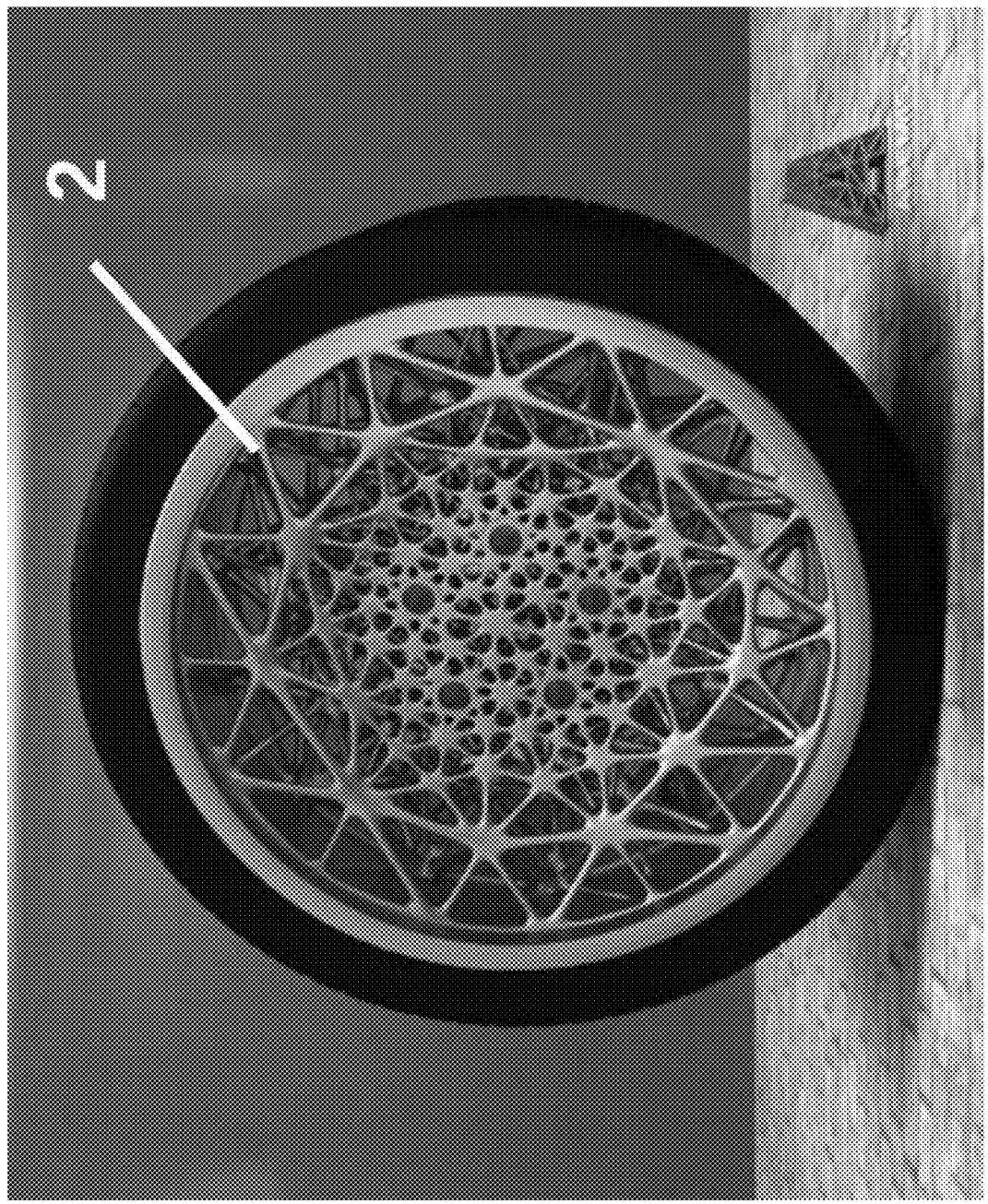
FIG. 12 shows a three-dimensional meta-structure model being incorporated into an automobile rim in accordance with an illustrative embodiment.

FIG. 12 shows a three-dimensional meta-structure model being incorporated into an automobile rim.

Figure 13:
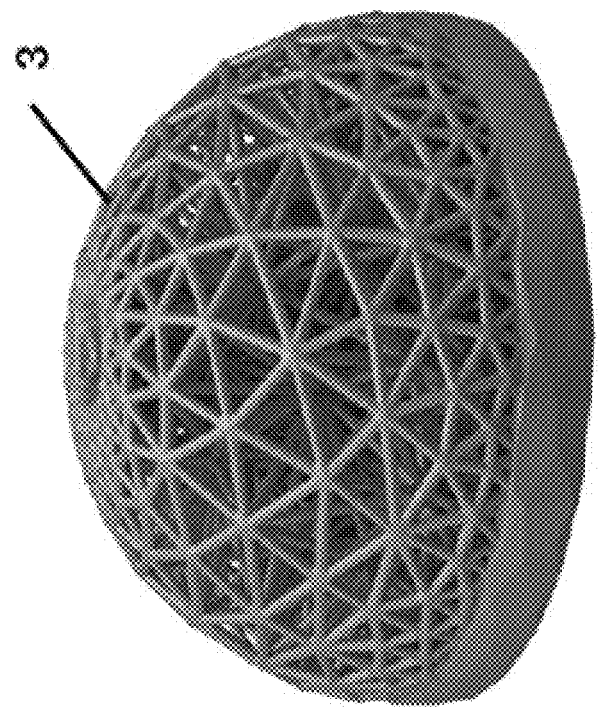
FIG. 13 shows a model of a prototype hip acetabulum (socket) with a connecting plate and center hole with three-dimensional meta-structure incorporated therein in accordance with an illustrative embodiment.

FIG. 13 shows a model of a prototype hip acetabulum (socket) with a connecting plate and center hole with three-dimensional meta-structure incorporated therein.

Figure 14:
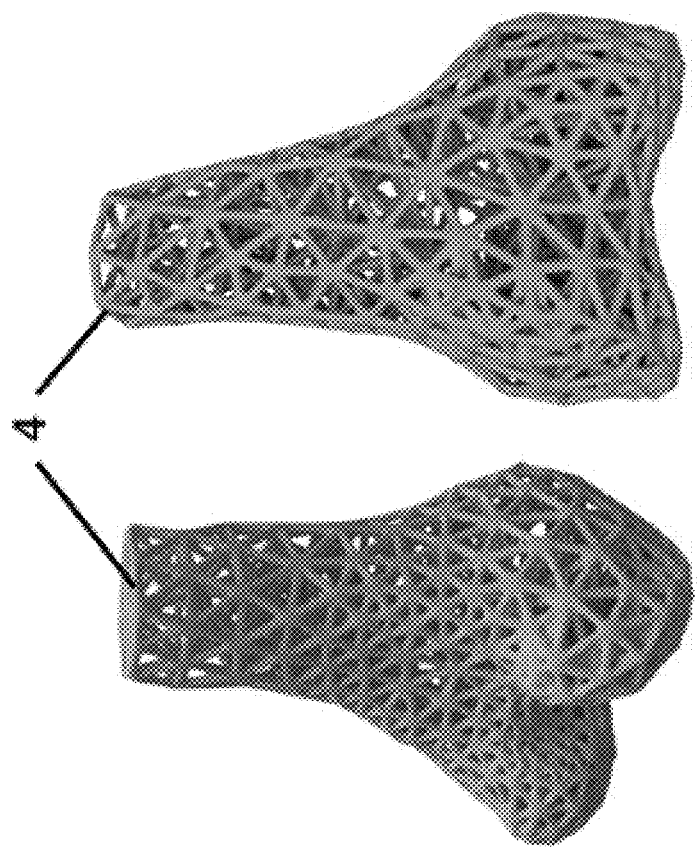
FIG. 14 shows a model of a human knee prosthesis with three-dimensional meta-structure forming porous scaffold for bone regeneration in accordance with an illustrative embodiment.

FIG. 14 shows a model 1400 of a human knee prosthesis with three-dimensional meta-structure forming porous scaffold for bone regeneration. The model 1400 was generated from reconstruction data of a MRI scan and is optimize to bear load with minimal material. The model 1400 can be 3D-printed in a biocompatible materials such as Titanium and resorbable Hydroxyapatite, PEEK or others.

It is noted that the exemplary three-dimensional meta-structure facilitates structural designs in bioengineering application in which surface and internal structural features can be tailored for a given application. In some embodiments, internal structure are designed/produced to provide highly flexible, strong biomaterials with optimized fluid-structure porosity, bone-ingrowth, flow and support characteristics.

Applications extend to general Mechanical Engineering parts, Aerospace, Automotive, and further most any part that can be realized either manually drawn (CAD) or from image based methods such as CT/MRI.

Discussion

The exemplified three-dimensional meta-structure ("Meshagons") are true meta-structures that are suitable for production with additive manufacturing (AM) systems and that are the product of algorithms that construct finite element mesh optimized with parametrically controlled topological and material parameters, for example, to best support loads with minimal material density requirements. That is, the exemplified three-dimensional meta-structure can be fundamental to generating parts with optimizable strength and ultra-light weight/density for a given material. It is observed that the exemplified three-dimensional meta-structure in a given design when produced in a workpiece (e.g. for mechanical or aerospace applications) can be significantly lighter (50%-80%) as compared to a workpiece produced from the same material for a given solid model.

Whereas a finite element mesh consists of "edges" and "nodes", the exemplified three-dimensional meta-structure is a fully manifold, 3-D printable, water-tight, multi-domain meta-mesh structure with controllable edge/node properties. The mesh are not lattice-based, which have truncated periodic structure. The term "water-tight" generally refers to the structure having a defined manifold outer/inner surface, e.g., without cracks or other leaks, which is suitable for additive manufacturing processes.

Further, an advantage of the exemplified three-dimensional meta-structure is the generating of highly complex 3D multi-connected shapes as a product of calculation (rather than a direct CAD modeling). In addition to be being more time-consuming to produce, Boolean combinations via CAD modeling often produce mesh structures having discontinuities (e.g., gaps or non-joined) in the joints that affects the manufacture-ability of such structures.

Further, the exemplified embodiments facilitate re-meshing of a finite-element mesh in an iterative manner to produce a multi-dimensional delineated meta-internal structure as, for example, shown and described in relation to FIG. 3B. These meta-internal structures constitutes a true topologically well-defined meta-structure. Further, the re-meshing iteration can be extended or continued ad-infinitum for branching configurations. Indeed, a Meshagon is not just one single solid structure, but is a field with multiple dimensions (nD, with analogies to molecular/atomic quantum modeling). The generated Meshagon field thus embodies the entire potential metatopology, in multiple dimensions, of the construct. The physical actual 3D/AM printed Meshagon is a 3D-manifold (e.g. printable), which is a "snapshot" of the overall field. It's like a silhouette, but instead of 3D to 2D—it is 4D to 3D, or more.

It is noted that the exemplified process can be iteratively performed not just in space, but also in time (or pseudo-time). This enables meta-structure generation with evolving properties or other time-dependent properties. That is, once a base Meshagon is calculated, either the whole Meshagon, or selected sub-regions can be re-computed (by definition viz. the fundamental meta-structure embodiment here), to generate a true multi-level meta-structure with potential for fractional dimension and furthermore time-based topological/property descriptive capabilities.

In some embodiments, a fractal structure can be used rather than a tetrahedral structure. The parameters and definition of the fractal structure can be defined and parametrically modified to generate the workpiece with defined (desired) structural and material properties.

Indeed, linkages and joints of the multi-level finite element mesh structure (e.g., ML-2 meta-structure) can be linearly, nonlinearly, or otherwise interpolated or specified to the linkages and joints of the above level finite element mesh structure (e.g., ML-1 meta-structure). Further sub-models can be defined according to such linear or non-linear description, ad-infinitum. To this end, geometric and topologic and functional properties of the three-dimensional meta-structure can be controlled and varied on a level-by-level (multi-dimensional) basis using linear or non-linear functions or definitions that can be set in computer readable instructions to be performed by a processor.

As used herein, processor refers to a physical hardware device that executes encoded instructions for performing functions on inputs and creating outputs. Exemplary processors for use in this disclosure are described herein in relation to FIGS. 1-5. In some embodiments, the processor may comprise a plurality of processors that are in communication with one another. Processors can include microprocessors, graphic-based processing units (GPUs), ASICs, microcontrollers, and quantum processors that can execute instructions.

As used herein, "computer" may include a plurality of computers. The computers may include one or more hardware components such as, for example, a processor, a random access memory (RAM) module, a read-only memory (ROM) module, a storage, a database, one or more input/output (I/O) devices, and an interface. Alternatively and/or additionally, computer may include one or more software components such as, for example, a computer-readable medium including computer executable instructions for performing a method associated with the exemplary embodiments. It is contemplated that one or more of the hardware components listed above may be implemented using software. For example, storage may include a software partition associated with one or more other hardware components. It is understood that the components listed above are exemplary only and not intended to be limiting.

Processor may include one or more processors, each configured to execute instructions and process data to perform one or more functions associated with a computer for indexing images. Processor may be communicatively coupled to RAM, ROM, storage, database, I/O devices, and interface. Processor may be configured to execute sequences of computer program instructions to perform various processes. The computer program instructions may be loaded into RAM for execution by processor.

RAM and ROM may each include one or more devices for storing information associated with operation of processor. For example, ROM may include a memory device configured to access and store information associated with the computer including information for identifying, initializing, and monitoring the operation of one or more components and subsystems. RAM may include a memory device for storing data associated with one or more operations of processor. For example, ROM may load instructions into RAM for execution by processor.

Storage may include any type of mass storage device, including network-based storage, configured to store information that processor may need to perform processes consistent with the disclosed embodiments. For example, storage may include one or more magnetic and/or optical disk devices, such as hard drives, CD-ROMs, DVD-ROMs, or any other type of mass media device.

Database may include one or more software and/or hardware components that cooperate to store, organize, sort, filter, and/or arrange data used by the computer and/or processor. For example, database may store the source CAD model and parameters to generate the three-dimensional meta-structure models therefrom. It is contemplated that database may store additional and/or different information than that listed above.

I/O devices may include one or more components configured to communicate information with a user associated with computer. For example, I/O devices may include a console with an integrated keyboard and mouse to allow a user to maintain a database of images, update associations, and access digital content. I/O devices may also include a display including a graphical user interface (GUI) for outputting information on a monitor. I/O devices may also include peripheral devices such as, for example, a printer for printing information associated with controller, a user-accessible disk drive (e.g., a USB port, a floppy, CD-ROM, or DVD-ROM drive, etc.) to allow a user to input data stored on a portable media device, a microphone, a speaker system, or any other suitable type of interface device.

Interface may include one or more components configured to transmit and receive data via a communication network, such as the Internet, a local area network, a workstation peer-to-peer network, a direct link network, a wireless network, or any other suitable communication platform. For example, interface may include one or more modulators, demodulators, multiplexers, demultiplexers, network communication devices, wireless devices, antennas, modems, and any other type of device configured to enable data communication via a communication network.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

While the methods and systems have been described in connection with certain embodiments and specific examples, it is not intended that the scope be limited to the particular embodiments set forth, as the embodiments herein are intended in all respects to be illustrative rather than restrictive.

What is claimed is:

1. A method to fabricate a three-dimensional meta-structure workpiece, the method comprising:
   iteratively building a section of the three-dimensional meta-structure workpiece in an additive manufacturing process from a model of the three-dimensional meta-structure workpiece,
   wherein the section includes a mesh structure comprising a plurality of interlinking linkages and joints that collectively form a three-dimensional manifold structure of tetrahedral, hexahedral, and/or fractal elements,
   wherein the plurality of interlinking linkages and joints each has a cross-sectional area that varies according to a specified profile,
   wherein the model is generated by i) converting a non-lattice finite element mesh model comprising a plurality of interlinking edges and nodes not having truncated periodic structure to a finite element mesh structure corresponding to the three-dimensional meta-structure workpiece and comprising the plurality of interlinking linkages and joints and ii) varying cross-sectional areas of each of the linkages and joints of the finite element mesh structure according to the specified profile.

2. The method of claim 1, wherein the model is generated by:
   obtaining or creating, by a processor, a source three-dimensional model of the three-dimensional meta-structure workpiece;
   converting, by the processor, the portion of the source three-dimensional model to a first finite element mesh structure, wherein the first finite element mesh structure comprises the plurality of interlinking linkages and joints; and
   varying, by the processor, the cross-sectional areas of each of the linkages and joints of the first finite element mesh structure according to a specified profile to produce the first three-dimensional meta-structure sub-model.

3. The method of claim 1, wherein the interlinking linkages and joints are formed as a second mesh structure comprising a set of second interlinking linkages and joints.

4. The method of claim 1, wherein the interlinking linkages and joints are formed as an internal structure in the section.

5. The method of claim 1, wherein the workpiece comprise a thermoplastic selected from the group consisting of: hydroxyapatite, polyetheretherketone (PEEK), polyaryletherketone (PAEK), other poly (ether ketone ketone) (PEKK), acrylonitile butadiene styrene (ABS), polylactic acid (PLA), polyvinyl alcohol (PVA), polycarbonate, polyphenylene sulfide (PPS), silicon, polyetherimide (PEI), polyphenyl sulfone (PPSU), and polyether sulfone (PES), and a combinations thereof.

6. The method of claim 1, wherein the workpiece comprises a metal or alloy selected from the group consisting of: steel, stainless steel, titanium, gold, silver, nickel, cobalt, iron, bronze, refractory metal, aluminum, zirconium, and a combination thereof.

7. The method of claim 1, wherein the iterative building step comprises powder bed fusion.

8. The method of claim 1, wherein the iterative building step comprises Vat polymerization.

9. The method of claim 1, wherein the iterative building step comprises material jetting.

10. The method of claim 1, wherein the iterative building step comprises binder jetting.

11. The method of claim 1, wherein the iterative building step comprises material extrusion.

12. The method of claim 1, wherein the iterative building step comprises multi-jet fusion (MJF).

13. The method of claim 1, wherein the mesh structure is optimized based on a topological parameter.

14. The method of claim 1, wherein the mesh structure is optimized for a pre-loaded load with minimal material density.

15. The method of claim 1, wherein the mesh structure is optimized for strength for a given material.

16. The method of claim 1, wherein the model is generated from a finite element mesh optimized with parametrically controlled topological or material parameters.

17. The method of claim 1, wherein the three-dimensional meta-structure workpiece is selected from the group consisting of:
a biomedical implant;
a mechanical frame component for an automobile;
a mechanical frame component for an aerospace system;
a mechanical frame component for a robotic system;
a mechanical frame component for an instrument; and
a mechanical frame component for an unmanned vehicle system.

18. An additive manufacturing system comprising:
a component configured to iteratively build a section of a three-dimensional meta-structure workpiece from a model of the three-dimensional meta-structure workpiece, wherein the component is configured to perform an operation selected from the group consisting of powder bed fusion, Vat polymerization, material jetting, binder jetting, material extrusion, and multi-jet fusion (MJF),
wherein the section includes a mesh structure comprising a plurality of interlinking linkages and joints that collectively form a three-dimensional manifold structure of tetrahedral, hexahedral, and/or fractal elements, and wherein the plurality of interlinking linkages and joints each has a cross-sectional area that varies according to a specified profile,
wherein the model is generated by i) converting a non-lattice finite element mesh model comprising a plurality of interlinking edges and nodes not having truncated periodic structure to a finite element mesh structure corresponding to the three-dimensional meta-structure workpiece and comprising the plurality of interlinking linkages and joints and ii) varying cross-sectional areas of each of the linkages and joints of the finite element mesh structure according to the specified profile.

19. The additive manufacturing system of claim 18, wherein the component comprises:
a processor; and
a memory having instructions stored thereon, wherein execution of the instructions by the processor, cause the processor to:
obtain the model of the three-dimensional meta-structure workpiece; and
direct in the fabrication of the three-dimensional meta-structure workpiece.

20. The additive manufacturing system of claim 19, wherein the component further comprises:
a second processor; and
a second memory having instructions stored thereon, wherein execution of the instructions by the second processor, cause the second processor to:
obtain or create a source three-dimensional model of the three-dimensional meta-structure workpiece;
define the section of the source three-dimensional model to convert to a first three-dimensional meta-structure sub-model; and
generate the model of the three-dimensional meta-structure workpiece having the first three-dimensional meta-structure sub-model by (i) generating a first finite element mesh model for the section of the source three-dimensional model, wherein the first finite element mesh model comprises the plurality of interlinking edges and nodes, (ii) convert the plurality of interlinking edges and nodes of the first finite element mesh model to a first finite element mesh structure comprising a corresponding set of interlinking linkages and joints that collectively define the three-dimensional manifold structure, and (iii) vary cross-sectional areas of the linkages and joints of the first finite element mesh structure according to the specified varying cross-sectional profile for at least a portion of the first finite element mesh structure.

* * * * *